United States Patent
Vargas et al.

(10) Patent No.: US 11,293,116 B2
(45) Date of Patent: Apr. 5, 2022

(54) TUNABLE AND RECONFIGURABLE ATOMICALLY THIN HETEROSTRUCTURES

(71) Applicant: Northeastern University, Boston, MA (US)

(72) Inventors: Anthony Vargas, Somerville, MA (US); Fangze Liu, Shijiazhuang (CN); Christopher Adrian Lane, Boston, MA (US); Daniel Rubin, Boston, MA (US); Swastik Kar, Belmont, MA (US); Arun Bansil, Dover, MA (US); Gianina Buda, Cambridge, MA (US); Zachariah Hennighausen, Boston, MA (US)

(73) Assignee: Northeastern University, Boston, MA (US)

( * ) Notice: Subject to any disclaimer, the term of this patent is extended or adjusted under 35 U.S.C. 154(b) by 276 days.

(21) Appl. No.: 16/326,856

(22) PCT Filed: Aug. 23, 2017

(86) PCT No.: PCT/US2017/048191
§ 371 (c)(1),
(2) Date: Feb. 20, 2019

(87) PCT Pub. No.: WO2018/039329
PCT Pub. Date: Mar. 1, 2018

(65) Prior Publication Data
US 2019/0211474 A1    Jul. 11, 2019

Related U.S. Application Data

(60) Provisional application No. 62/378,345, filed on Aug. 23, 2016.

(51) Int. Cl.
C30B 25/02 (2006.01)
C30B 29/46 (2006.01)
(Continued)

(52) U.S. Cl.
CPC .............. *C30B 29/46* (2013.01); *C30B 25/02* (2013.01); *C30B 29/68* (2013.01); *C30B 30/00* (2013.01);
(Continued)

(58) Field of Classification Search
CPC ....... G11B 7/1369; C30B 29/68; C30B 29/46; C30B 33/02; C30B 33/04; C30B 30/00;
(Continued)

(56) References Cited

FOREIGN PATENT DOCUMENTS

WO    2018039329 A1    3/2018

OTHER PUBLICATIONS

Aretouli et al., "Epitaxial 2D SnSe2/2D WSe2 van der walls heterostructures", ACS Appl. Mater. Interfac., vol. 8 pp. 23222-23229 (Aug. 18, 2016).*
(Continued)

*Primary Examiner* — Martin J Angebrannndt
(74) *Attorney, Agent, or Firm* — Hamilton, Brook, Smith & Reynolds, P.C.

(57) ABSTRACT

Heterocrystals of metal dichalcogenides and $Bi_2S_3$, $Bi_2Se_3$ or $Bi_2Te_3$ are presented, in which the metal dichalcogenides and $Bi_2S_3$, $Bi_2Se_3$ or $Bi_2Te_3$ do not largely retain their independent properties. These heterocrystals exhibit electronic and optical changes, which make them attractive for beyond-silicon electronics and optoelectronics. Particularly, these heterocrystals can be re-configured in a manner that allows bit writing and pattern drawing. Embodiments of these heterocrystals, methods of forming these heterocrystals, methods of reconfiguring the heterocrystals, information storage devices, optoelectronic circuits and photonic crystals are presented.

26 Claims, 34 Drawing Sheets

(51) Int. Cl.
| | |
|---|---|
| C30B 29/68 | (2006.01) |
| C30B 30/00 | (2006.01) |
| C30B 33/02 | (2006.01) |
| C30B 33/04 | (2006.01) |
| G11B 7/1369 | (2012.01) |
| H01L 21/02 | (2006.01) |

(52) U.S. Cl.
CPC .............. *C30B 33/02* (2013.01); *C30B 33/04* (2013.01); *G11B 7/1369* (2013.01); *H01L 21/02485* (2013.01); *H01L 21/02499* (2013.01); *H01L 21/02505* (2013.01); *H01L 21/02568* (2013.01); *H01L 21/0262* (2013.01)

(58) Field of Classification Search
CPC .............. C30B 25/02; H01L 21/02485; H01L 21/02568; H01L 21/02505; H01L 21/0262; H01L 21/02499
See application file for complete search history.

(56) References Cited

OTHER PUBLICATIONS

Wi, "Advanced nanofabrication technologies for making photo-response device based on emerging layered transiton metal dichalcogenides", Thesis, U. Mich., (Jun. 2016).*
Wang et al., "Abberation corrected high angle annular dark field (HAADF) scanning transmission electron microscopy (STEM) and in situ transmission electron microscopy (TEM) study of transition metal dichalcogenides (TMDs)", Microsc. Microanal vol. 21(3) paper 0216 pp. 431-432 (2015).*
Clarke et al., "(BiSe)1.23CrSe2 and (BiSe)1.22(Cr1.2Se2)2" molecular anisotropy in the first structurally characterized Bi-Cr ternary compounds, Inorg. Chem., vol. 54 pp. 2765-2771 (2015).*
Vargas, "Optical properties of nanoscale bismuth selenide and its heterocrystals", PhD Thesis, Northwestern University Apr. 2016.*
Liu et al., "Dispersive growth and laser induced rippling of large area single layer MoS2 nanosheets by CVD on c-plane sapphire substrate". Sci. Rep., vol. 5, article 1175, 8 pages (2015).*
Chiu et al., "Spectroscopic signatures for interlayer coupling in MoS2-WSe2 van der Waals stacking", ACSnano vol. 8(9) pp. 9649-9656 (Sep. 2014).*
Venkatakrishnan et al., "Microencryption on atomic monolayers enabled by direct laser writing", IRC conference on Science, Engineering and technology 4 pages (May 2016).*
Hou et al., "Modulating photoluminescence of monolayers molybdenum disulfide by metal-insulator phase transition in active substrates", Small vol. 12(29) pp. 3976-3984 (Jun. 20, 2016).*
Notification Concerning Transmittal of International Preliminary Report on Patentability for International Application No. PCT/US2017/048191, "Tunable and Reconfigurable Atomically Thin Heterostructures", dated Feb. 28, 2019.
International Search Report and the Written Opinion of the International Searching Authority, International Application No. PCT/US2017048191, filed Aug. 23, 2017, entitled "Tunable and Reconfigurable Atomically Thin Heterostructures", dated Nov. 3, 2017.
Xenog I Anno Pou Lou et al: High-qual ity, large-area MoSe 2 and Mose 2 /Bi 2 Se 3 heterostructures on AlN (0001)/Si(III) substrates by molecular beam epitaxy, Nanoscale, vol. 7, No. 17, Mar. 24, 2015 (Mar. 24, 2015) pp. 7896-7905, XP055418712, United Kingdom ISSN: 2040-3364, DOI: 10.1039/C4NR06874B.
Suresh Vishwanath et al: "Abstract", Journal of Materials Research, vol. 31, No. 07, Jan. 6, 2016 (Jan. 6, 2016), pp. 900-910, XP055418690, us ISSN: 0884-2914, DOI: 10.1557/jmr.2015.374.
Jiandong Yao et al: "Layered-material WS 2 /topological insulator Bi 2 Te 3 heterostructure photodetector with ultrahigh responsivity in the range from 370 to 1550 nm", Journal of Materials Chemistry C: Materials for Optical and Electronic Devices, vol. 4, No. 33, Jul. 19, 2016 (Jul. 19, 2016), pp. 7831-7840, XP055418703, UK ISSN: 2050-7526, DOI: 10.1039/C6TC01453D UK ISSN: 2050-7526, DOI: 10.1039/C6TC01453D.

* cited by examiner

FIG. 20A
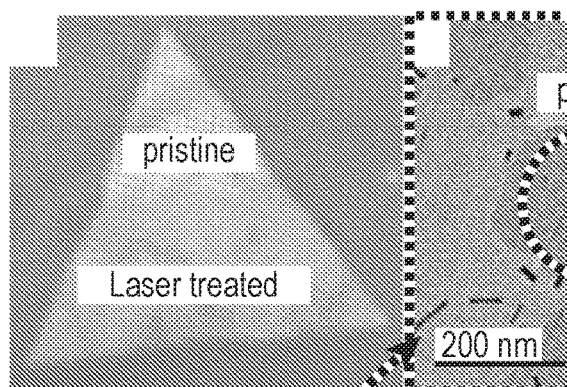
FIG. 20B
FIG. 20C
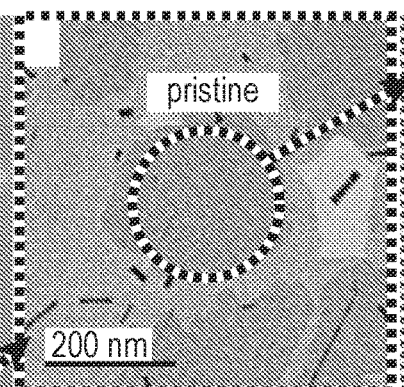
FIG. 20D
FIG. 20E
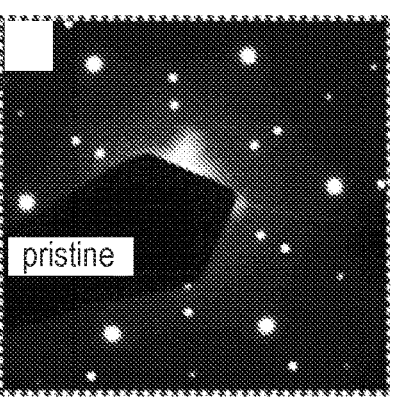
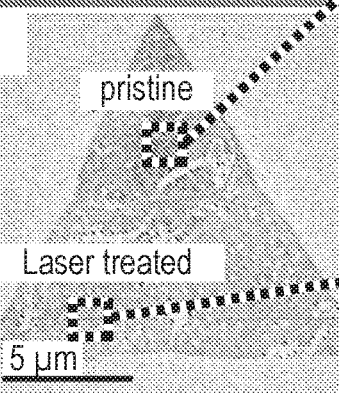
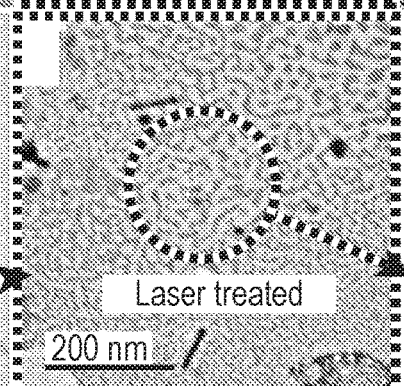
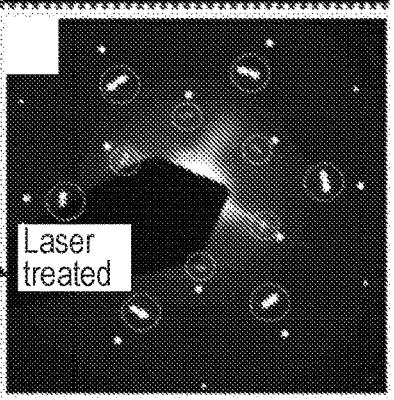
FIG. 20F

TUNABLE AND RECONFIGURABLE ATOMICALLY THIN HETEROSTRUCTURES

RELATED APPLICATIONS

This application is the U.S. National Stage of International Application No. PCT/US2017/048191, filed on Aug. 23, 2017, which designates the U.S., published in English, and claims the benefit of U.S. Provisional Application No. 62/378,345, filed on Aug. 23, 2016. The entire teachings of the above applications are incorporated herein by reference.

GOVERNMENT SUPPORT

This invention was made with government support under Grant No. NSF CAREER ECCS1351424 awarded by The National Science Foundation. The government has certain rights in the invention.

This invention was made with government support under Grant No. DE-FG02-07ER46352 awarded by the U.S. Department of Energy. The government has certain rights in the invention.

This invention was made with government support under Grant No. DE-AC02-05CH11231 awarded by The U.S. Department of Energy. The government has certain rights in the invention.

This invention was made with government support under Grant No. DE-SC0012575 awarded by The U.S. Department of Energy. The government has certain rights in the invention.

BACKGROUND

Atomically-thin layered materials such as graphene, transition metal dichalcogenides, and a range of other layered compounds remain one of the most exciting systems for exploring a wide range of novel electronic, excitonic, valley, and correlated physics under two-dimensional (2D) confinement, and possess immense potential in nanoelectronics, optoelectronics, photodetection, memory, and hybrid systems for energy conversion and storage. Appropriate stacking of two such crystallographically similar or commensurate 2D layers has been shown to result in exotic charge and spin states due to lattice-matching, long-range inter-layer coupling, strain, or formation of Moiré bands.

Progress in direct synthesis of various stacked layers of similar and dissimilar crystals with atomically-clean interfaces using chemical vapor deposition (CVD) growth has opened up the possibility for exploring functional synergy in beyond-commensurate 2D-crystal pairs. However, most studies have shown that other than trivial charge-transfer, crystallographically dissimilar 2D materials such as $MoS_2$/graphene hetero-layers largely retain their independent properties.

SUMMARY

Heterocrystals of metal dichalcogenides and $Bi_2S_3$, $Bi_2Se_3$ or $Bi_2Te_3$ are presented, in which the metal dichalcogenides and $Bi_2S_3$, $Bi_2Se_3$ or $Bi_2Te_3$ do not largely retain their independent properties. Experimental results show electronic and optical changes for these heterocrystals, including formation of an indirect band gap and 100% photoluminescence (PL) suppression, tunable transmittance-edge (e.g., 1.1 eV→0.75 eV for heterocrystals of $MoS_2$ and $Bi_2Se_3$), suppressed Raman, and wide-band evolution of spectral transmittance. The range of edge energies is highly attractive for beyond-silicon electronics and optoelectronics, especially for telecommunications wavelengths that require active electronics at the 1550 nm (0.8 eV) standard. Tunable absorbance, reflectance and photoemission in these crystals make them potentially important for various photovoltaic and photodetection applications in the visible range. Disrupting the rotational alignment using a focused laser results in a reversal of PL, Raman, and transmittance, demonstrating that in-situ manipulation of interfaces can enable "reconfigurable" 2D materials. This writing approach can be utilized to demonstrate 2D heterocrystals with patterns, arrays, and optical information (bit) storage abilities. The heterocrystals can be used in various photonic, plasmonic and optoelectronic applications that may benefit from such highly precise optical arrays and circuit-drawing in an atomically-thin material.

These heterocrystals have several advantages. In contrast to conventional silicon-based optoelectronic devices which usually have thicknesses that range from hundreds of nanometers to few micrometers, the heterocrystals described herein can be atomically thin (e.g., less than 20 nm in thickness). This makes these heterocrystals attractive for flexible, wearable, transferrable, low-power, light-weight nanoelectronics, optoelectronics, nanophotonics, nanoplasmonics, and energy harvesting applications. Further, the heterocrystals described herein can be reconfigured, for example, with a beam of electromagnetic waves (e.g., provided by a laser or high intensity light emitting diode) or with a beam of particles (e.g., a beam of electrons) with sub-micron resolution. This allows bit writing for information storage and also the writing of patterns for drawing optoelectronic circuits or photonic/plasmonic crystals. Conventional silicon-based materials can only be patterned by sophisticated lithography and etching processes. Yet further, the heterocrystals described herein can be grown using methods such as chemical vapor deposition, which is cheaper and more energy efficient than the production of single crystal semiconductors.

One embodiment is a heterocrystal consisting of a metal dichalcogenide having the formula $ME_2$ in contact with $Bi_2S_3$, $Bi_2Se_3$ or $Bi_2Te_3$, wherein M is a Cr, Mo, or W and E is S, Se, or Te; provided that when $ME_2$ is $MoS_2$ then the metal dichalcogenide is in contact with $Bi_2Se_3$.

A further embodiment is an information storage device comprising a heterocrystal as described herein.

Yet a further embodiment is a method of forming a heterocrystal, comprising growing a crystalline layer of $ME_2$ and growing a crystalline layer of $Bi_2S_3$, $Bi_2Se_3$ or $Bi_2Te_3$, wherein M is a Cr, Mo, or W and E is S, Se, or Te.

Another embodiment is a method of reconfiguring a heterocrystal, comprising providing a heterocrystal described herein, and exposing positions of the heterocrystal to a beam of electromagnetic waves or particles sufficient to reconfigure the heterocrystal in the positions being exposed.

BRIEF DESCRIPTION OF THE DRAWINGS

The patent or application file contains at least one drawing executed in color. Copies of this patent or patent application publication with color drawings will be provided by the Office upon request and payment of the necessary fee.

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

FIG. 20A shows an optical image of a few-nanometer-thick ($MoS_2$ and $Bi_2S_3$) heterocrystal grown on a $Si_3N_4$ TEM membrane, with part of the crystal being laser treated as shown.

FIG. 20B shows a low-magnification TEM image of a few-nanometer-thick ($MoS_2$ and $Bi_2S_3$) heterocrystal grown on a $Si_3N_4$ TEM membrane, with part of the crystal being laser treated as shown.

FIG. 20C shows a high-magnification TEM image of the pristine ($MoS_2$ and $Bi_2S_3$) heterocrystal area indicated by the dotted circle in the top of FIG. 19B.

FIG. 20D shows a high-magnification TEM image of the laser-treated ($MoS_2$ and $Bi_2S_3$) heterocrystal area indicated by the dotted circle in the bottom of FIG. 19B, showing that the laser-treated area has lost its homogeneity and has become poly-crystalline with nanoscale grains.

FIG. 20E provides a selected area electron diffraction (SAED) pattern from the pristine area shown in FIG. 20C.

FIG. 20F provides a selected area electron diffraction (SAED) pattern from the laser-treated area in FIG. 20D, and reveals that the $Bi_2Se_3$ crystal nano-domains in the laser-treated samples lose their rotational alignment with the $MoS_2$ crystal resulting in their rotationally spread-out diffraction patterns (outlined by dashed circles).

DETAILED DESCRIPTION

The heterocrystals of the present invention comprise a metal dichalcogenide having the formula $ME_2$ and $Bi_2S_3$, $Bi_2Se_3$ or $Bi_2Te_3$.

Generally, M can be Cr, Mo, or W and E can be S, Se, or Te. Typically, M is Mo or W and E is S, Se or Te. More typically, M is Mo or W and E is Se or Te.

In embodiments, the heterocrystals have a layer metal dichalcogenide in contact with a layer of $Bi_2S_3$, $Bi_2Se_3$ or $Bi_2Te_3$. Typically, this contact can be established by chemically vapor depositing the metal dichalcogenide on top of a layer of $Bi_2S_3$, $Bi_2Se_3$ or $Bi_2Te_3$, or chemically vapor depositing $Bi_2S_3$, $Bi_2Se_3$ or $Bi_2Te_3$ on top of a layer of metal dichalcogenide.

The layer of metal dichalcogenide can consist of one to five tri-layers of metal dichalcogenide. Typically, the layer of metal dichalcogenide is one tri-layer of metal dichalcogenide, also referred to herein as a "monolayer".

As used herein, a "tri-layer" refers to three layers of atoms corresponding to the three atoms in the chemical formula $ME_2$. For example, a bottom layer of atoms E, a middle layer of atoms M, and a top layer of atoms E. See, for example, FIG. 6A for such a tri-layer for $MoS_2$.

The layer of $Bi_2S_3$, $Bi_2Se_3$ or $Bi_2Te_3$ can consist of one to 25 quintuple-layers of $Bi_2S_3$, $Bi_2Se_3$ or $Bi_2Te_3$. Typically, the layer of $Bi_2S_3$, $Bi_2Se_3$ or $Bi_2Te_3$ comprises one to 10 quintuple-layers of $Bi_2S_3$, $Bi_2Se_3$ or $Bi_2Te_3$. More typically, the layer of $Bi_2S_3$, $Bi_2Se_3$ or $Bi_2Te_3$ consists of one to 20, one to 15, one to 10, one to eight, one to six, one to five, two to 10, two to five, or three to five quintuple-layers of $Bi_2S_3$, $Bi_2Se_3$ or $Bi_2Te_3$. Yet more typically, the layer of $Bi_2S_3$, $Bi_2Se_3$ or $Bi_2Te_3$ consists of one to five quintuple-layers of $Bi_2S_3$, $Bi_2Se_3$ or $Bi_2Te_3$.

Figures 6A, 6B, 6C:
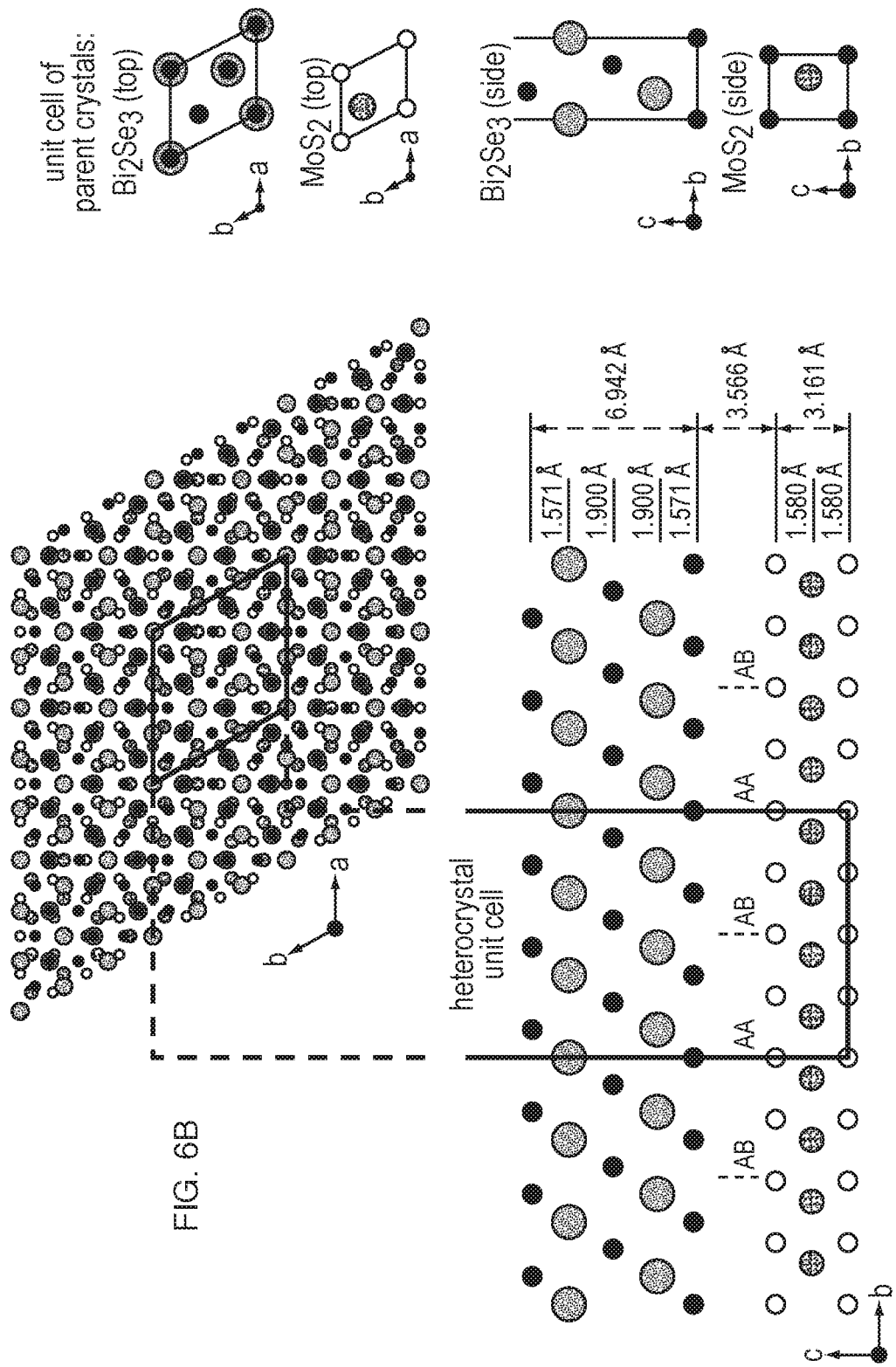
FIG. 6A is a schematic representation of the geometry-optimized proposed structure of the 1TL-1QL ($MoS_2$ and $Bi_2S_3$) heterocrystal in the side view, where the unit cell of the heterocrystal structure has been demarcated using the outline 610.
FIG. 6B is a schematic representation of the geometry-optimized proposed structure of the 1TL-1QL ($MoS_2$ and $Bi_2S_3$) heterocrystal of FIG. 6A in the top view, where the unit cell of the heterocrystal structure has been demarcated using the outline 620.
FIG. 6C is a schematic representation of the top and side views of the parent unit cells for the heterocrystal of FIGS. 6A and 6B.

As used herein, a "quintuple-layer" refers to three layers of atoms corresponding to the five atoms in the chemical formulas $Bi_2S_3$, $Bi_2Se_3$ and $Bi_2Te_3$. For example, a bottom layer of atoms Se, a next layer of atoms Bi, a middle layer of atoms Se, a further layer of atoms Bi, and a top layer of atoms Se, as shown in FIG. 6A.

By selecting the number of tri-layers and quintuple-layers the transmittance-edge of the heterocrystals can be tuned, for example, from 1.1 eV to 0.75 eV.

A first embodiment is a heterocrystal consisting of a metal dichalcogenide having the formula $ME_2$ in contact with $Bi_2S_3$, $Bi_2Se_3$ or $Bi_2Te_3$, wherein M is a Cr, Mo, or W and E is S, Se, or Te; provided that when $ME_2$ is $MoS_2$ then the metal dichalcogenide is in contact with $Bi_2Se_3$.

The heterocrystals can be atomically thin (i.e., have an average thickness in the nano meter range). For example, the average thickness of the heterocrystals can be between 2 nm and 50 nm. More typically, the average thickness of the heterocrystals can be between 2 nm and 20 nm. Yet more typically the average thickness of the heterocrystals can be between 2 nm and 6 nm.

The layers of metal dichalcogenide and $Bi_2S_3$, $Bi_2Se_3$ or $Bi_2Te_3$ are typically crystalline, which, as used herein, is meant to include that areas of the layers can be polycrystalline.

The $ME_2$ and $Bi_2S_3$, $Bi_2Se_3$ or $Bi_2Te_3$ can be characterized as having crystallographically incommensurate parent unit cells. As used herein, "crystallographically incommensurate" refers to crystal layers with significantly (i.e., more than 3%) different lattice parameters.

The layers of $ME_2$ and $Bi_2S_3$, $Bi_2Se_3$ or $Bi_2Te_3$ can be formed (e.g., grown with chemical vapor deposition) on a substrate or without a substrate (i.e., as a free standing film, following, for example, procedures analogues to the ones disclosed in Waduge et al. "Direct and Scalable Deposition of Atomically Thin Low-Noise MoS2 Membranes on Apertures", *ACS Nano,* 2015, 9(7), pp 7352-7359).

The substrate can be planar or nonplanar (e.g., curved). Suitable substrate surfaces that can provide planar surfaces include, but are not limited to, a quartz crystal surface, a surface of Si, a surface of a $SiO_2$/Si substrate, a surface of graphene, a surface of graphite, or a surface of a $Si_3N_4$ membrane.

The heterocrystals can be characterized by lattice matching. For example, the heterocrystal can be characterized by lattice matching between 4×4 unit cells of $MoS_2$ and 3×3 unit cells of $Bi_2Se_3$, lattice matching between 4×4 unit cells of $WS_2$ and 3×3 unit cells of $Bi_2Se_3$, or lattice matching between 5×5 unit cells of $MoSe_2$ and 4×4 unit cells of $Bi_2Se_3$.

It has been found that heterocrystals of the present invention are reconfigurable, that is, they, or areas/positions of the heterocrystal, can be configured in a first configuration with first properties (e.g., suppressed photoluminescence) and then changed into a second configuration with second properties (e.g., unsuppressed photoluminescence), as for example described in the below Examples Section.

Reconfiguration can be achieved by disrupting the interface area in which the $ME_2$ and $Bi_2S_3$, $Bi_2Se_3$ or $Bi_2Te_3$ contact. The disruption can be limited to selected positions, wherein the selected positions can encode bits of information or the positions form any desired pattern, for example, a pattern reflecting a photonic or optoelectronic circuit.

The difference in photoluminescence between positions of suppressed photoluminescence and positions of unsuppressed photoluminescence is typically a difference that is reliably detectable with known detectors in the art. For example, the photoluminescence can be suppressed by at least 5%, at least 10%, at least 20%, at least 30%, at least 40%, at least 50%, at least 60%, at least 70%, at least 80%, or at least 90% relative to the photoluminescence at the positions which are not suppressed.

Positions or areas of the heterocrystal can have been exposed to a beam of electromagnetic waves or particles sufficient to reconfigure the heterocrystal in the positions or areas that have been exposed. For example, source of light with wavelength centered in the range of 200 nm to 1100 nm can be used. Suitable power densities can be in the range from 100 $nW/\mu m^2$ to 1 $mW/\mu m^2$. Suitable exposure time ranges are typically based on a particular desired application. For example, for an information storage device which is required to store information quickly (e.g., because it is meant to rewritable), shorter exposure times are required than for an information storage device which is meant to be premanufactured with information. With shorter exposure time typically higher power densities are required, and with longer exposure time typically lower power densities are required.

Depending on the desired information density or required spatial resolution of patterns to be written in the heterocrystal, the spot size of the beam of electromagnetic waves or particles can be suitably adjusted. Spot sizes of below 100 $\mu m$, below, 10 $\mu m$, or below 1 $\mu m$ can be used.

Suitable sources of beams of electromagnetic waves include, but are not limited to, lasers and light emitting diodes. Suitable source of beams of particles, include but are not limited to, electron beam sources.

In one embodiment of the heterocrystal of the first embodiment, E is S or Se. In one aspect of this embodiment, M is Mo or W. In a further aspect of this embodiment or any of the foregoing aspects of this embodiment, the metal dichalcogenide is in contact with $Bi_2Se_3$. In yet a further aspect of this embodiment or any of the foregoing aspects of this embodiment, the heterocrystal consists of $MoS_2$ in contact with $Bi_2Se_3$. In yet a further aspect of this embodiment or any of the foregoing aspects of this embodiment, the heterocrystal comprises one tri-layer of $ME_2$. In yet a further aspect of this embodiment or any of the foregoing aspects of this embodiment, the heterocrystal comprises at least one quintuple layer of $Bi_2S_3$, $Bi_2Se_3$ or $Bi_2Te_3$. In yet a further aspect of this embodiment or any of the foregoing aspects of this embodiment, the heterocrystal comprises between 1 and 25 quintuple layers of $Bi_2S_3$, $Bi_2Se_3$ or $Bi_2Te_3$. In yet a further aspect of this embodiment or any of the foregoing aspects of this embodiment, the heterocrystal comprises between 1 and 5 quintuple layers of $Bi_2S_3$, $Bi_2Se_3$ or $Bi_2Te_3$. In yet a further aspect of this embodiment or any of the foregoing aspects of this embodiment, the average thickness of the heterocrystal is between about 2 nm and 20 nm. In yet a further aspect of this embodiment or any of the foregoing aspects of this embodiment, the average thickness of the heterocrystal is between about 2 nm and 6 nm. In yet a further aspect of this embodiment or any of the foregoing aspects of this embodiment, the heterocrystal comprises a crystalline layer of $ME_2$ in contact with a crystalline layer of $Bi_2S_3$, $Bi_2Se_3$ or $Bi_2Te_3$. In yet a further aspect of this embodiment or any of the foregoing aspects of this embodiment, the $ME_2$ and $Bi_2S_3$, $Bi_2Se_3$ or $Bi_2Te_3$ are characterized by crystallographically incommensurate parent unit cells. In yet a further aspect of this embodiment or any of the foregoing aspects of this embodiment, the heterocrystal comprises a crystalline layer of $ME_2$ in contact with a crystalline layer of $Bi_2S_3$, $Bi_2Se_3$ or $Bi_2Te_3$, wherein the crystalline layer of $ME_2$ has an average thickness of about 1 nm and the crystalline layer of $Bi_2S_3$, $Bi_2Se_3$ or $Bi_2Te_3$ has an average thickness of about 1 nm to 5 nm. In yet a further aspect of this embodiment or any of the foregoing aspects of this embodiment, the $ME_2$ or $Bi_2S_3$, $Bi_2Se_3$ or $Bi_2Te_3$ was grown on a nonplanar surface or a planar surface, or without a substrate. In yet a further aspect of this embodiment or any of the foregoing aspects of this embodiment, the $ME_2$ or $Bi_2S_3$, $Bi_2Se_3$ or $Bi_2Te_3$ was grown on a the planar surface, wherein the planar surface is a quartz crystal surface, a surface of Si, a surface of a $SiO_2$/Si substrate, a surface of graphene, a surface of graphite, or a surface of a $Si_3N_4$ membrane. In yet a further aspect of this embodiment or any of the foregoing aspects of this embodiment, the $Bi_2S_3$, $Bi_2Se_3$ or $Bi_2Te_3$ was grown on the $ME_2$, or the $ME_2$ was grown on the $Bi_2S_3$, $Bi_2Se_3$ or $Bi_2Te_3$. In yet a further aspect of this embodiment or any of the foregoing aspects of this embodiment, the $ME_2$ was grown on a planar surface using chemical vapor deposition and the $Bi_2S_3$, $Bi_2Se_3$ or $Bi_2Te_3$ was grown on top of the $ME_2$ using chemical vapor deposition, or the $Bi_2S_3$, $Bi_2Se_3$ or $Bi_2Te_3$ was grown on a planar surface using chemical vapor deposition and the $ME_2$ was grown on top of the $Bi_2S_3$, $Bi_2Se_3$ or $Bi_2Te_3$ using chemical vapor deposition. In yet a further aspect of this embodiment or any of the foregoing aspects of this embodiment, the $ME_2$ is $MoS_2$ characterized by a lattice spacing of 3.1622±0.0276 Å. In yet a further aspect of this embodiment or any of the foregoing aspects of this embodiment, the $Bi_2Se_3$ is characterized by a lattice spacing of 4.1401±0.0223 Å. In yet a further aspect of this embodiment or any of the foregoing aspects of this embodiment, the heterocrystal is characterized by lattice matching between 4×4 unit cells of $MoS_2$ and 3×3 unit cells of $Bi_2Se_3$, lattice matching between 4×4 unit cells of $WS_2$ and 3×3 unit cells of $Bi_2Se_3$, or lattice matching between 5×5 unit cells of $MoSe_2$ and 4×4 unit cells of $Bi_2Se_3$. In yet a further aspect of this embodiment or any of the foregoing aspects of this embodiment, $ME_2$ and $Bi_2S_3$, $Bi_2Se_3$ or $Bi_2Te_3$ provide a rotationally-aligned epitaxial stack. In yet a further aspect of this embodiment or any of the foregoing aspects of this embodiment, the heterocrystal is a 2D-heterocrystal. In yet a further aspect of this embodiment or any of the foregoing aspects of this embodiment, the $ME_2$ and $Bi_2S_3$, $Bi_2Se_3$ or $Bi_2Te_3$ have an interface area in which they contact, and the interface has been disrupted in selected positions to thereby reverse suppression of photoluminescence in these positions. In yet a further aspect of this embodiment or any of the foregoing aspects of this embodiment, positions of the heterocrystal exhibit unsuppressed photoluminescence whereas elsewhere the heterocrystal exhibits suppressed photoluminescence. In yet a further aspect of this embodiment or any of the foregoing aspects of this embodiment, positions of the heterocrystal exhibit photoluminescence whereas elsewhere photoluminescence is suppressed by at least 90% relative to the photoluminescence at the positions, wherein the positions form a pattern encoding information. In yet a further aspect of this embodiment or any of the foregoing aspects of this embodiment, positions of the heterocrystal exhibit photoluminescence whereas elsewhere photoluminescence is suppressed by at least 90% relative to the photoluminescence at the positions. In yet a further aspect of this embodiment or any of the foregoing aspects of this embodiment, positions of the heterocrystal with suppressed photoluminescence and positions with photoluminescence represent bits of information. In yet a further aspect of this embodiment or any of the foregoing aspects of this embodiment, positions of the heterocrystal with suppressed photoluminescence and positions with photoluminescence are part of a photonic circuit or optoelectronic circuit. In yet a further aspect of this embodiment or any of the foregoing aspects of this embodiment, positions of the heterocrystal have been exposed to a beam of electromagnetic waves or particles sufficient to reconfigure the heterocrystal in the positions being exposed. In yet a further aspect of this embodiment or any of the foregoing aspects of this embodiment, positions of the heterocrystal have been exposed to a beam of electromagnetic waves or particles to form exposed areas with submicrometer spatial resolution. In yet a further aspect of this embodiment or any of the foregoing aspects of this embodiment, positions of the heterocrystal have been exposed to a beam of electromagnetic waves or particles to form exposed areas of increased average height and root means square surface roughness relative to untreated areas. In yet a further aspect of this embodiment or any of the foregoing aspects of this embodiment, positions of the heterocrystal have been exposed to a beam of electromagnetic waves or particles to form exposed areas of an average height increased by 0.35 to 0.45 nm. In yet a further aspect of this embodiment or any of the foregoing aspects of this embodiment, positions of the heterocrystal have been exposed to a beam of electromagnetic waves or particles to form exposed areas of randomly-oriented grains of $Bi_2Se_3$ that remain attached to a surface of $ME_2$. In yet a further aspect of this embodiment or any of the foregoing aspects of this embodiment, positions of the heterocrystal have been exposed to a beam of electromagnetic waves or particles to form exposed areas with photoluminescence recovered by at least 10% relative to untreated areas. In yet a further aspect of this embodiment or any of the foregoing aspects of this embodiment, positions of the heterocrystal have been exposed to a beam of electromagnetic waves or particles, wherein the the beam of electromagnetic waves or particles is a beam of laser light or an electron beam. In yet a further aspect of this embodiment or any of the foregoing aspects of this embodiment, positions of the heterocrystal have been light-treated by exposing the positions to light of a wavelength of 200 nm to 1100 nm focused onto a spot size below 10 μm with 100 nW/μm2 to 1 mW/μm2 intensity. In yet a further aspect of this embodiment or any of the foregoing aspects of this embodiment, positions of the heterocrystal have been light-treated by exposing the positions to light of a wavelength of about 488 nm focused onto a spot size below 1 μm with about 76 $\mu W/\mu m^2$ intensity.

Information Storage Devices, Optoelectronic Circuits and Photonic Crystals

A second embodiment is an information storage device comprising a heterocrystal of the first embodiment or any embodiment or aspect of embodiment thereof described herein.

In one embodiment of the information storage device of the second embodiment, the information storage device further comprises a source of a beam of electromagnetic waves or particles suitable for forming positions of suppressed photoluminescence. In an aspect of this embodiment, the information storage device further comprises a source of heat suitable for annealing the heterocrystal to reverse suppression of photoluminescence in positions of suppressed photoluminescence. In yet a further aspect of this embodiment or any of the foregoing aspects of this embodiment, the information storage device further comprises a light detector suitable for distinguishing positions of suppressed photoluminescence from those of unsuppressed photoluminescence.

Figure 33:
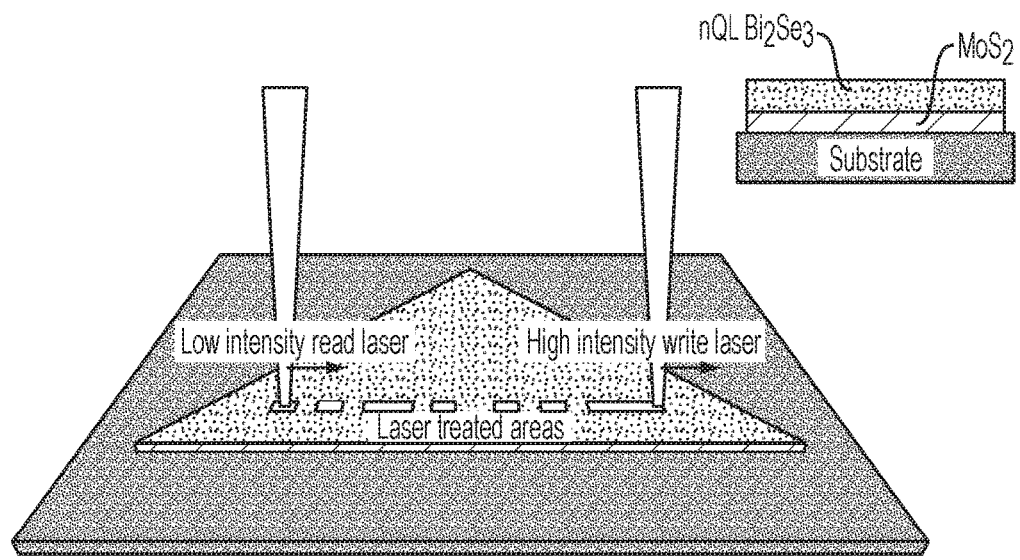
FIG. 33 shows a schematic of an information storage device in accordance with an embodiment of the invention.

FIG. 33 shows a schematic of an information storage device in accordance with an embodiment of the invention. As shown in FIG. 33, a heterocrystal, for example, a heterocrystal of the first embodiment or any embodiment or aspect of embodiment thereof described herein (e.g., a heterocrystal having a layer of $MoS_2$ in contact with a layer of nQL $Bi_2Se_3$, wherein n is from 1 to 25, for example, from 1 to 5, quintuple layers) is formed on a substrate. Suitable substrates include those described herein. Positions of the heterocrystal in the embodiment of an information storage device shown in FIG. 33 have been laser-treated with a high intensity write laser. Accordingly, the heterocrystal in FIG. 33 has positions which exhibit unsuppressed photoluminescence whereas elsewhere, the heterocrystal exhibits suppressed photoluminescence. The positions of suppressed photoluminescence and the positions of unsuppressed photoluminescence can be distinguished and, hence, read by a low-intensity read laser, as shown in FIG. 33.

A third embodiment is an optoelectronic circuit comprising a heterocrystal of the first embodiment or any embodiment or aspect of embodiment thereof described herein, in which at least part of the optoelectronic circuit has been formed by reconfiguring positions of the heterocrystal. In an aspect of this embodiment, the reconfiguring was performed using a method of reconfiguring of the sixth embodiment or an aspect thereof, as described below.

Figure 34:
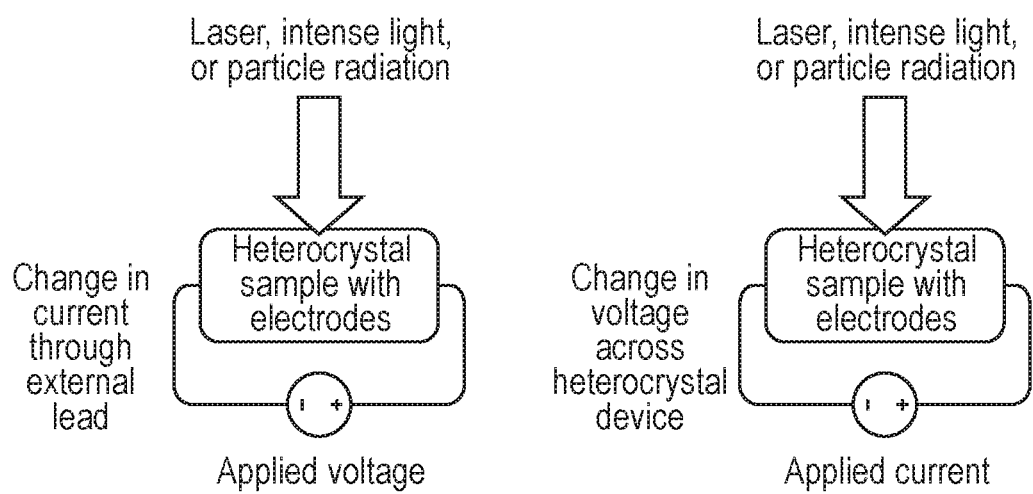
FIG. 34 shows a schematic of an optoelectronic circuit in accordance with an embodiment of the invention.

FIG. 34 shows a schematic of an optoelectronic circuit in accordance with an embodiment of the invention. As shown in FIG. 34, a heterocrystal, for example, a heterocrystal of the first embodiment or any embodiment or aspect of embodiment thereof described herein, in which at least part of the optoelectronic circuit has been formed by reconfiguring positions of the heterocrystal, is fitted with electrodes and incorporated into an electronic circuit comprising a power source (e.g., voltage source). A suitable source of beams of electromagnetic waves (e.g., a laser) or particles can be used to apply intense light or particle radiation to the heterocrystal (e.g., positions of the heterocrystal). Suitable sources of beams of electromagnetic waves and particles include those described herein. In the presence of applied voltage, the optoelectronic circuit will exhibit a change in current through an external lead. In the presence of applied current, the optoelectronic circuit will exhibit a change in voltage across the circuit.

A fourth embodiment is a photonic crystal comprising a heterocrystal of the first embodiment or any embodiment or aspect of embodiment thereof described herein, wherein the heterocrystal exhibits a photonic pattern which has been formed by reconfiguring positions of the heterocrystal. In an aspect of this embodiment, the reconfiguring was performed using a method of reconfiguring of the sixth embodiment or an aspect thereof, as described below.

Figure 35C:
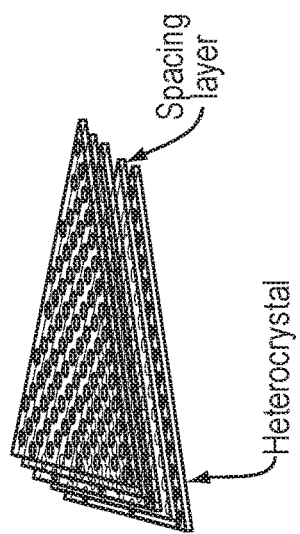
FIG. 35C shows a schematic of a three-dimensional photonic crystal in accordance with an embodiment of the invention.
Figure 35B:
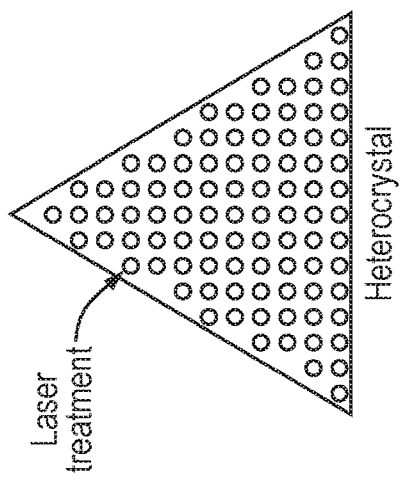
FIG. 35B shows a schematic of a two-dimensional photonic crystal in accordance with an embodiment of the invention.
Figure 35A:
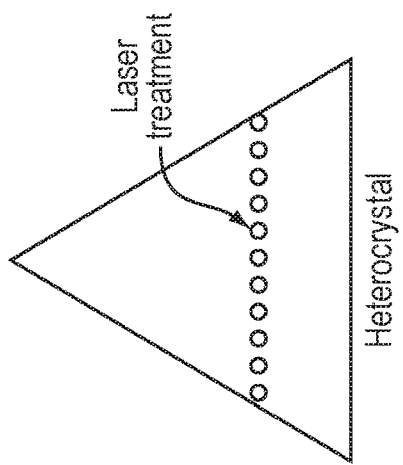
FIG. 35A shows a schematic of a one-dimensional photonic crystal in accordance with an embodiment of the invention.

FIGS. 35A-35C show schematics of a one-dimensional (FIG. 35A), two-dimensional (FIG. 35B) and three-dimensional (FIG. 35C) photonic crystal in particular embodiments of the invention. In FIG. 35C, the photonic crystal includes a first heterocrystal (e.g., a heterocrystal of the first embodiment or any embodiment or aspect of embodiment thereof described herein), a first spacing layer, a second heterocrystal (e.g., a heterocrystal of the first embodiment or any embodiment or aspect of embodiment thereof described herein), a second spacing layer and a third heterocrystal (e.g., a heterocrystal of the first embodiment or any embodiment or aspect of embodiment thereof described herein). The periodic patterns on the heterocrystals can be generated by laser treatment.

Methods of Forming a Heterocrystal

A fifth embodiment is a method of forming a heterocrystal, comprising growing a crystalline layer of $ME_2$ and growing a crystalline layer of $Bi_2S_3$, $Bi_2Se_3$ or $Bi_2Te_3$, wherein M is a Cr, Mo, or W and E is S, Se, or Te.

In one embodiment of the heterocrystal forming method of the fifth embodiment, the crystalline layer of $Bi_2S_3$, $Bi_2Se_3$ or $Bi_2Te_3$ is grown on top of a crystalline layer of $ME_2$, or the crystalline layer of $ME_2$ is grown on top of a crystalline layer of $Bi_2S_3$, $Bi_2Se_3$ or $Bi_2Te_3$. In an aspect of this embodiment, the crystalline layers are grown by chemical vapor deposition. In yet a further aspect of this embodiment or any of the foregoing aspects of this embodiment, the crystalline layer of $ME_2$ is a single tri-layer and the crystalline layer of $Bi_2S_3$ or $Bi_2Se_3$ or $Bi_2Te_3$ has 1 to 25 quintuple-layers. In yet a further aspect of this embodiment or any of the foregoing aspects of this embodiment, the method comprises growing a crystalline layer of ME2 to an average thickness of about 1 nm and growing a crystalline layer of Bi2S3, Bi2Se3 or Bi2Te3 to an average thickness of about 1 nm to about 20 nm.

Methods of Reconfiguring Heterocrystals

A sixth embodiment is a method of reconfiguring a heterocrystal, comprising providing a heterocrystal of the first embodiment or any embodiment or aspect of embodiment thereof described herein, and exposing positions of the heterocrystal to a beam of electromagnetic waves or particles sufficient to reconfigure the heterocrystal in the positions being exposed. In an aspect of this embodiment, the method comprises exposing the positions to light of a wavelength of 200 nm to 1100 nm focused onto a spot size below 10 µm with 100 nW/µm² to 1 mW/µm² intensity. In yet a further aspect of this embodiment or any of the foregoing aspects of this embodiment, the method comprises exposing the positions to light of a wavelength of about 488 nm focused onto a spot size below 1 µm with about 76 µW/µm² intensity.

A description of example embodiments follows.

EXAMPLES

2D Heterocrystals Obtained by Epitaxial Stacking of Crystallographically Incommensurate $Bi_2Se_3$ and $MoS_2$ Atomic Layers 1 tri-layer (TL) $MoS_2$ single crystals were first synthesized on various substrates, followed by depositing $Bi_2Se_3$ quintuple layers (QLs), both using CVD (A. Vargas, S. Basak, F. Z. Liu, B. K. Wang, E. Panaitescu, H. Lin, R. Markiewicz, A. Bansil, S. Kar, The changing colors of a quantum-confined topological insulator. ACS Nano 8, 1222-1230 (2014); I. Bilgin, F. Z. Liu, A. Vargas, A. Winchester, M. K. L. Man, M. Upmanyu, K. M. Dani, G. Gupta, S. Talapatra, A. D. Mohite, S. Kar, Chemical vapor deposition synthesized atomically thin molybdenum disulfide with optoelectronic-grade crystalline quality. ACS Nano 9, 8822-8832 (2015)). Monolayer (1TL) $MoS_2$ has a very strong photoluminescence (PL) signature, and it was used as the starting crystal to grow 1- and few-QL $Bi_2Se_3$ layers on top of $MoS_2$. Since the heterocrystal unit cell contains dissimilar number of $MoS_2$ and $Bi_2Se_3$ unit cells, the present description refers to the corresponding layers as TL and QL (instead of $Mo_{16}S_{32}$ and $Bi_{18}Se_{27}$ etc.), respectively. By varying the synthesis conditions, it was possible to obtain samples whose overall thicknesses were those corresponding to 1TL⊕nQL, where nQL denotes the thickness equivalent of n-quintuple-layers of $Bi_2Se_3$.

Figure 1:
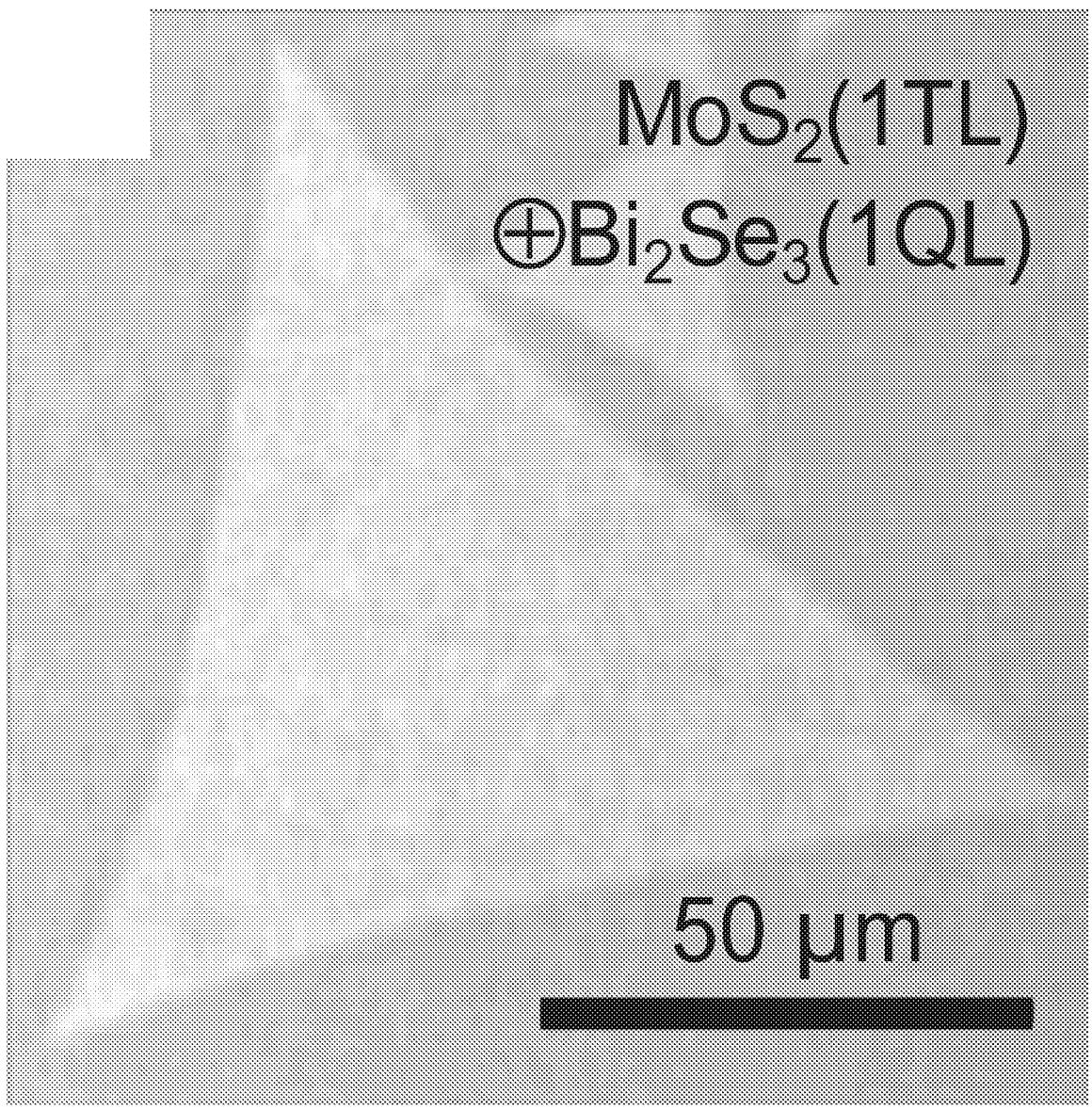
FIG. 1 provides an optical image of a heterocrystal of 1QL-thick $Bi_2Se_3$ grown on monolayer (1TL) $MoS_2$ on quartz. The contrast has been intentionally enhanced to obtain better visibility.
Figure 2:
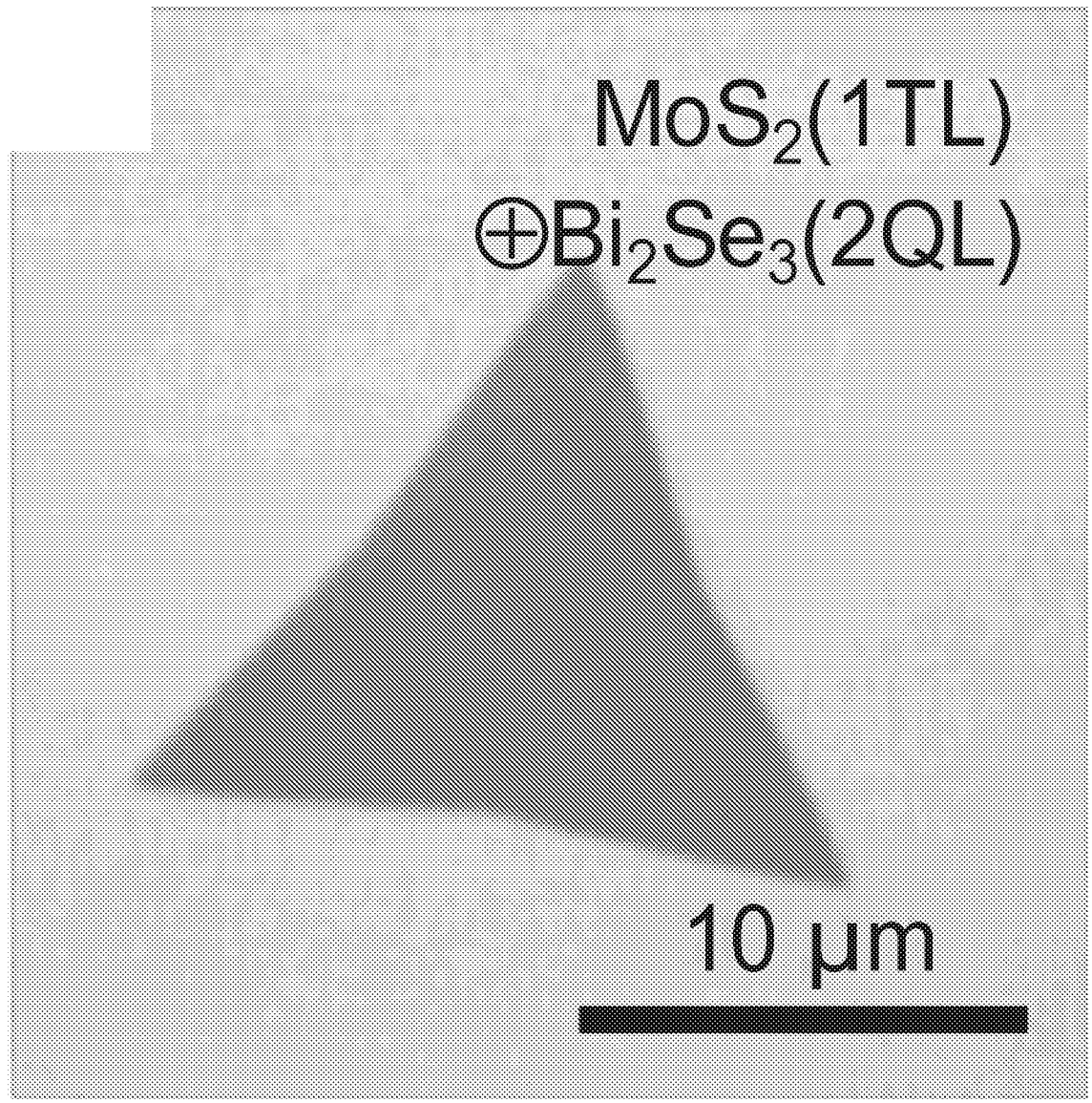
FIG. 2 provides an optical image of a heterocrystal of 2QL-thick $Bi_2Se_3$ grown on monolayer (1TL) $MoS_2$ on SiO2/Si substrate.
Figure 3:
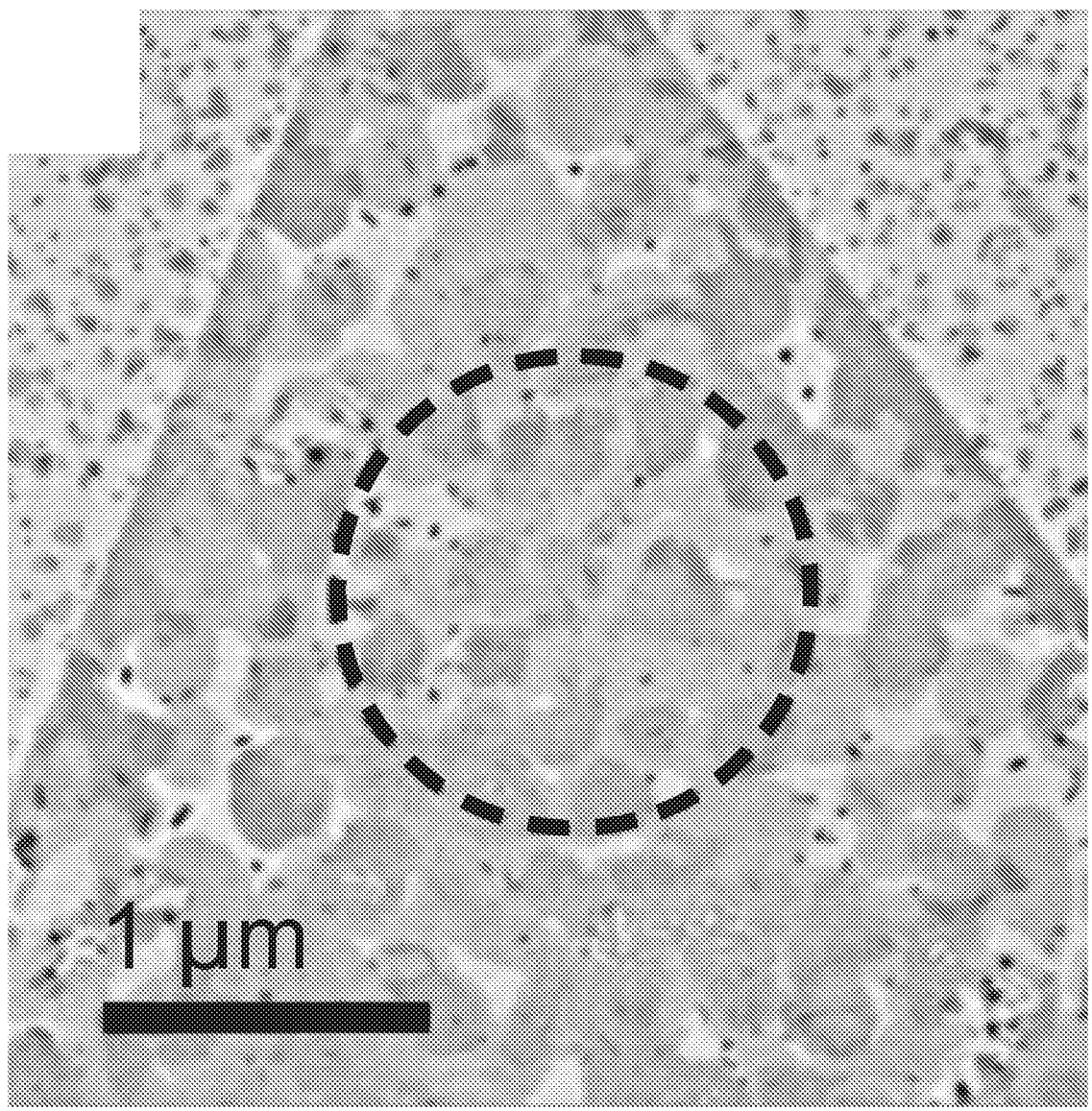
FIG. 3 provides a low-magnification TEM image of a 1TL-$MoS_2$ sample (grown on a $Si_3N_4$ TEM membrane) partially covered with few-QL thickness $Bi_2Se$ grains.
Figure 4:
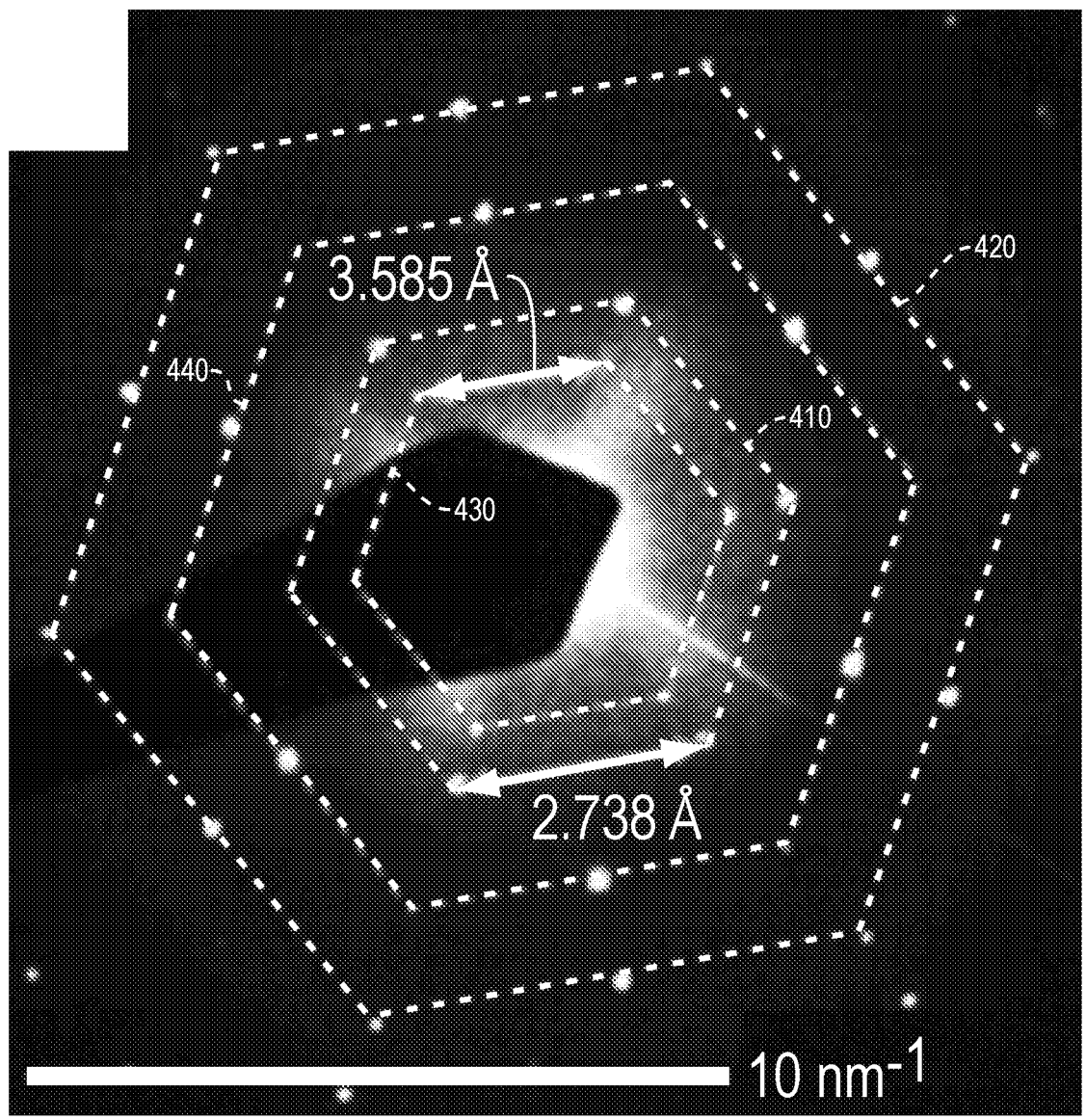
FIG. 4 provides an SAED pattern of the sample taken from the region outlined by the dashed circle in FIG. 3.

FIGS. 1 and 2 show typical optical images of 1TL⊕1QL and 1TL⊕2QL heterocrystals, grown on quartz and $SiO_2$/Si substrates, where the QLs have uniform 1- or 2-layer coverage, respectively. The notation of 1TL⊕1QL is meant to denote that $Bi_2Se_3$ was grown on top of $MoS_2$. FIG. 3 shows a low-magnification transmission electron microscope (TEM) image of a QL growth-arrested sample revealing grains formed from multiple QL nucleation sites on the 1TL surface. Despite the multi-nucleation growth, selected area electron diffraction (SAED, FIG. 4) of the composite structure reveals a single distinct set of points representing a superposition of $MoS_2$— (B. Li, S. X. Yang, N. J. Huo, Y. T. Li, J. H. Yang, R. X. Li, C. Fan, F. Y. Lu, Growth of large area few-layer or monolayer $MoS_2$ from controllable $MoO_3$ nanowire nuclei. RSC Adv. 4, 26407-26412 (2014) and $Bi_2Se_3$— (Y. Liu, Y. Y. Li, S. Rajput, D. Gilks, L. Lari, P. L. Galindo, M. Weinert, V. K. Lazarov, L. Li, Tuning Dirac states by strain in the topological insulator $Bi_2Se_3$. Nat. Phys. 10, 294-299 (2014)) type diffraction patterns (410 and 420 representing $MoS_2$ and 430 and 440 representing $Bi_2Se_3$), with perfect crystallographic alignment. Analysis of the diffraction spots leads to $MoS_2$ lattice spacing of 3.1622±0.0276 Å, and the $Bi_2Se_3$ lattice spacing of 4.1401±0.0223 Å. The ratio of these two lattice parameters is within the accuracy of our TEM, and suggests a novel lattice matching between 4×4 unit cells of $MoS_2$ and 3×3 unit cells of $Bi_2Se_3$.

Figure 5:
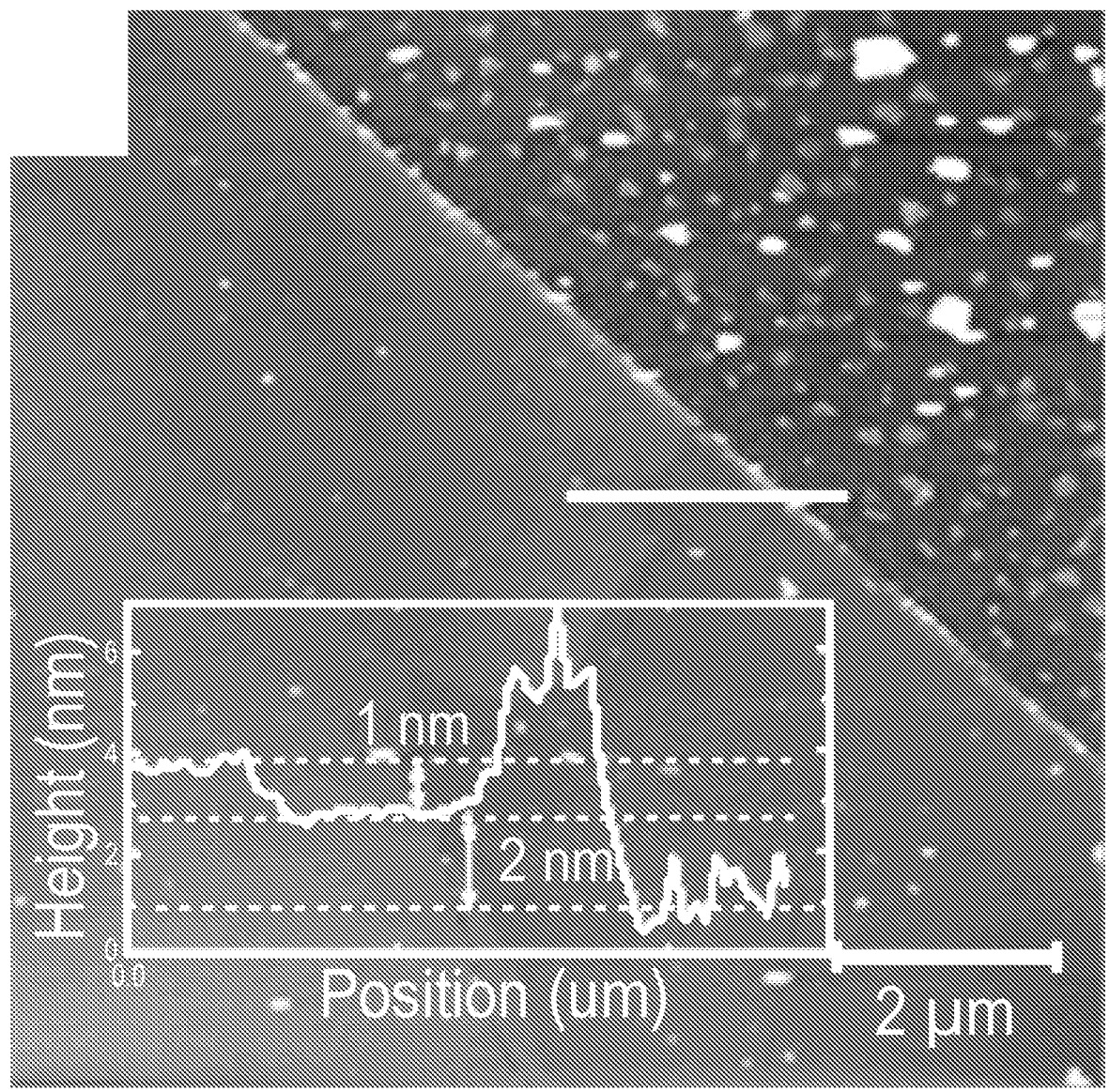
FIG. 5 provides an AFM step-height analysis along a $Bi_2Se_3$ step-edge in a $MoS_2$ and $Bi_2S_3$ heterocrystal, where the step-heights were found to be about 0.9-1.1 nm.

FIG. 5 shows the AFM topographic image of a crystal with a QL step-edge separating 1TL⊕1QL and 1TL⊕2QL regions; the QLs being about 0.9-1.1 nm in height. The geometry-optimized density functional theory (DFT) structure of a proposed 1TL⊕1QL heterocrystal with various atomic dimensions is shown in FIG. 6A (side view) and FIG. 6B (top view). The in-plane lattice parameters were fixed to experimental values, while allowing the atoms to relax along the c-axis. This resulted in a QL step-height of 1.06 nm in excellent agreement with our experimental results. The unit cell of the 1TL⊕1QL heterocrystals contains 16 MoS$_2$ parent unit cells and 9 Bi$_2$Se$_3$ unit cells; both A-A and A-B type stacking were present within the same unit cell, as shown in FIG. 6A. The parent unit cells are shown in FIG. 6C for comparison. These results suggest that MoS$_2$ and Bi$_2$Se$_3$ can form rotationally-aligned epitaxial stacks through space-filling (along each crystallographic axis) by a ratio of number of unit cells that is the inverse of the ratio of their lattice parameters. To our knowledge, this is the first instance of such a unique 2D crystal structure built from completely incommensurate parent unit cells.

Figure 7:
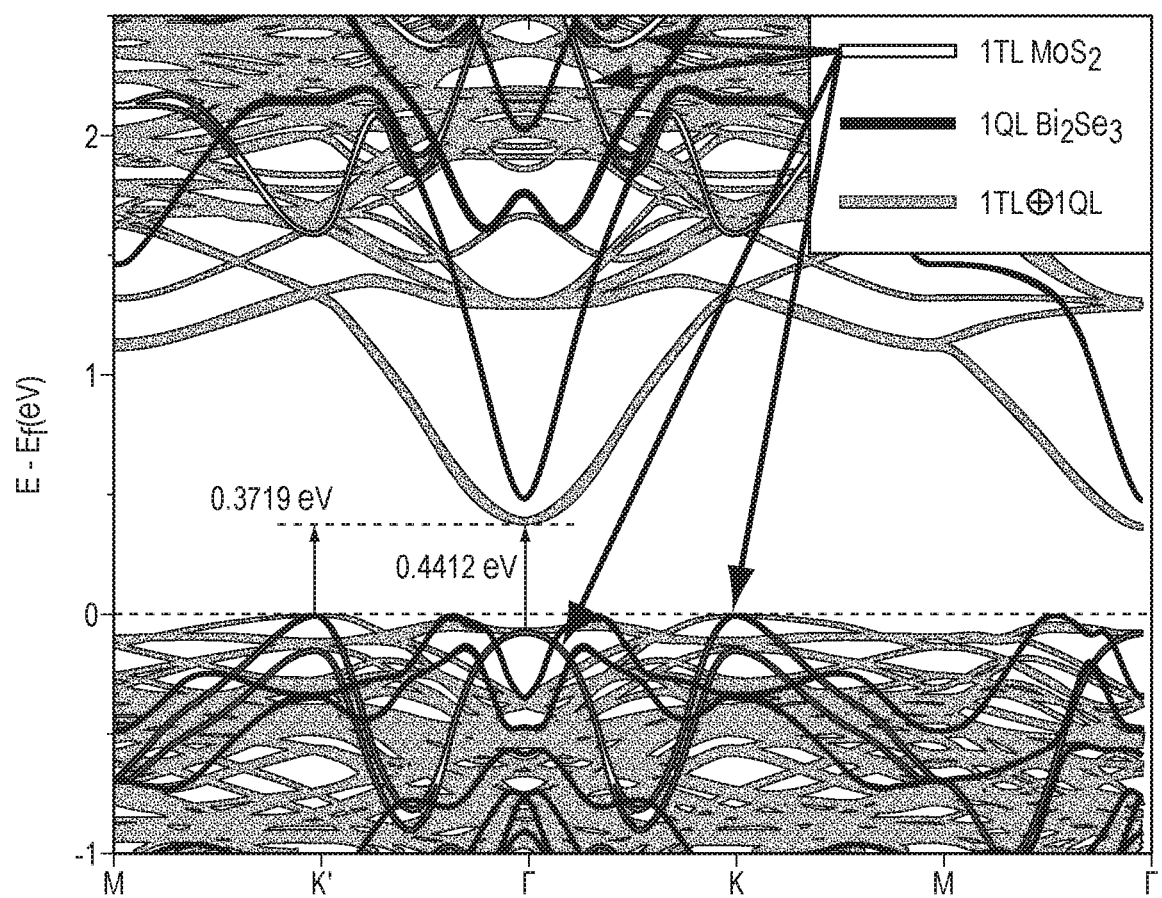
FIG. 7 is a graph directed to the first-principles band structure of pristine 1TL $MoS_2$, 1QL $Bi_2Se_3$, and 1TL⊕1QL heterocrystal, the latter having an indirect band gap at the F-point in sharp contrast to the direct gap of 1TL $MoS_2$ at the K-point of the first Brillouin zone.
Figure 8:
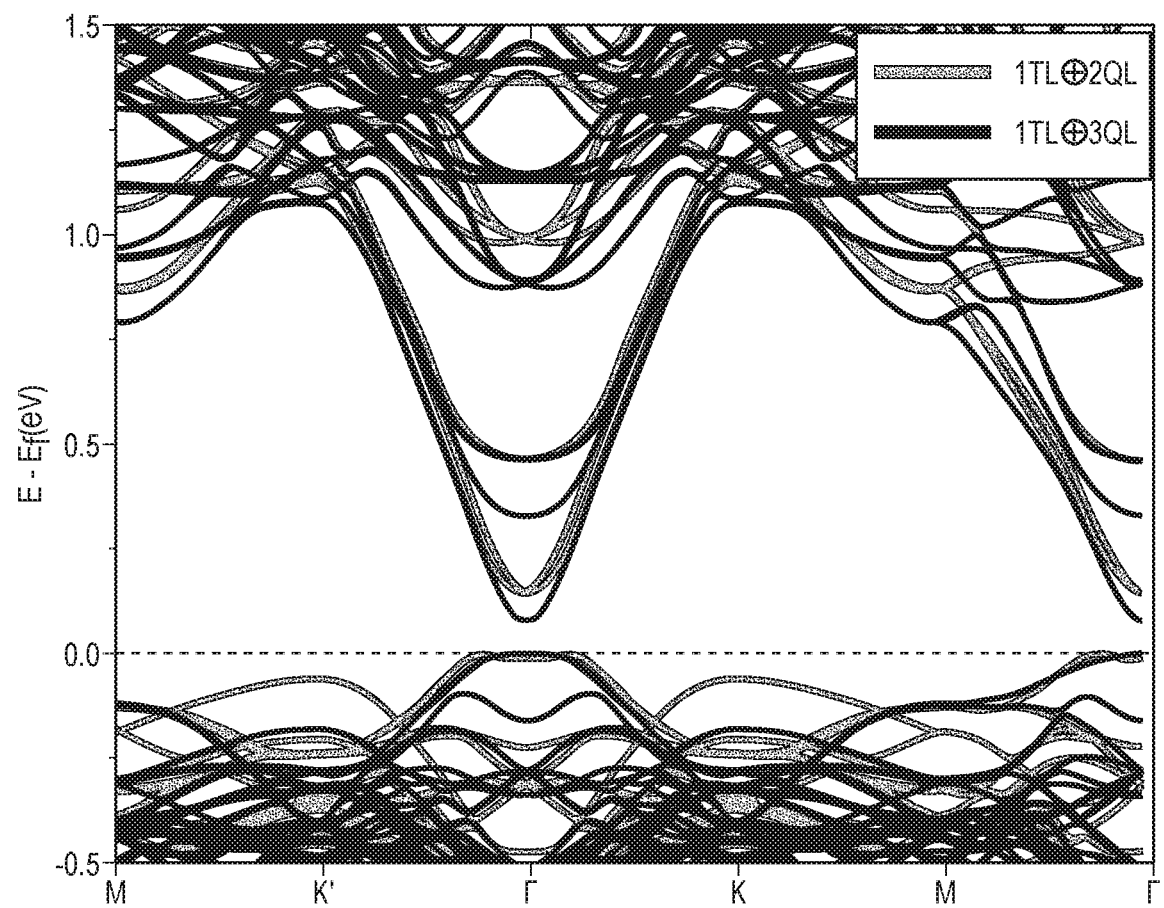
FIG. 8 is a graph directed to the band structure of the 1TL⊕2QL and 1TL⊕3QL ($MoS_2$ and $Bi_2S_3$) heterocrystals, showing progressively decreasing gaps between the valence and conduction bands with increasing QL thickness.

FIG. 7 shows the calculated first-principles band structures of the 1TL⊕1QL heterocrystals, superimposed on those of the parent monolayer crystals for comparison. 1TL MoS$_2$ has a direct band gap located at the K and K' points of the 1st Brillouin zone that results in a signature PL peak at E~1.85 eV (A. Splendiani, L. Sun, Y. B. Zhang, T. S. Li, J. Kim, C. Y. Chim, G. Galli, F. Wang, Emerging photoluminescence in monolayer MoS$_2$. *Nano Lett.* 10, 1271-1275 (2010)), while 1QL Bi$_2$Se$_3$ is characterized by an indirect transition gap of ~0.5 eV, with the direct gap being structure of the parent crystals and the daughter heterocrystals are attributed to strong TL-QL interaction despite their incommensurate lattices. Indeed, Raman spectroscopic investigations revealed that in 1 and 2 QL heterocrystals, the inter-layer interactions are strong enough to substantially suppress the dominant Raman peaks of both MoS$_2$ and Bi$_2$Se$_3$ in stark contrast with heterolayers of 2D materials with weak, van der Waals interactions, where signature Raman peaks of individual layers are largely undiminished (Y. J. Gong, J. H. Lin, X. L. Wang, G. Shi, S. D. Lei, Z. Lin, X. L. Zou, G. L. Ye, R. Vajtai, B. I. Yakobson, H. Terrones, M. Terrones, B. K. Tay, J. Lou, S. T. Pantelides, Z. liu, W. Zhou, P. M. Ajayan, Vertical and in-plane heterostructures from WS$_2$/MoS$_2$ monolayers. *Nat. Mater.* 13, 1135-1142 (2014); X. P. Hong, J. Kim, S. F. Shi, Y. Zhang, C. H. Jin, Y. H. Sun, S. Tongay, J. Q. WU, Y. F. Zhang, F. Wang, Ultrafast charge transfer in atomically thin MoS$_2$/WS$_2$ heterostructures. *Nat. Nanotechnol.* 9, 682-686 (2014); J. T. Yuan, S. Najmaei, Z. H. Zhang, J. Zhang, S. D. Lei, P. M. Ajayan, B. I. Yakobson, Photoluminescence quenching and charge transfer in artificial heterostacks of monolayer transition metal dichalcogenides and few-layer black phosphorus. *ACS Nano* 9, 555-563 (2015); P. Gehring, B. F. Gao, M. Burghard, K. Kern, Growth of high-mobility Bi$_2$Te$_2$Se nanoplatelets on hBN sheets by van der Waals epitaxy. *Nano Lett.* 12, 5137-5142 (2012)). FIG. 8 shows the band structure of the 1TL⊕2QL and 1TL⊕3QL heterocrystals, according to which the band gap continues to decrease with increasing QL thickness, which is consistent with the decreasing gap obtained from optical measurements.

Figure 9:
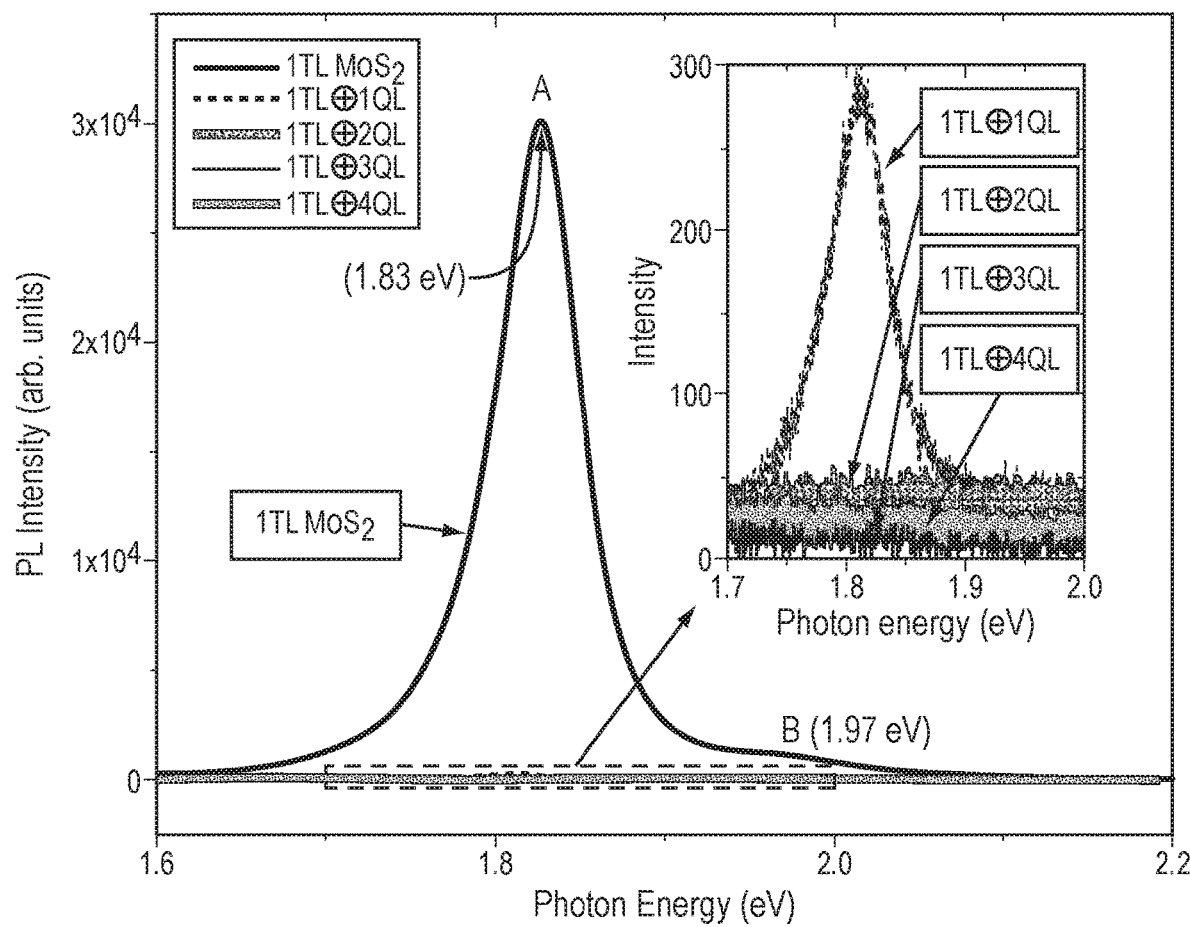
FIG. 9 provides the signature PL spectrum in a 1TL $MoS_2$ sample (A and B peaks are labelled), which is completely quenched in the ($MoS_2$ and $Bi_2S_3$) heterocrystals, as well as an inset which highlights how 99% of the PL was quenched by addition of 1QL of $Bi_2Se_3$ on 1TL $MoS_2$.
Figure 10:
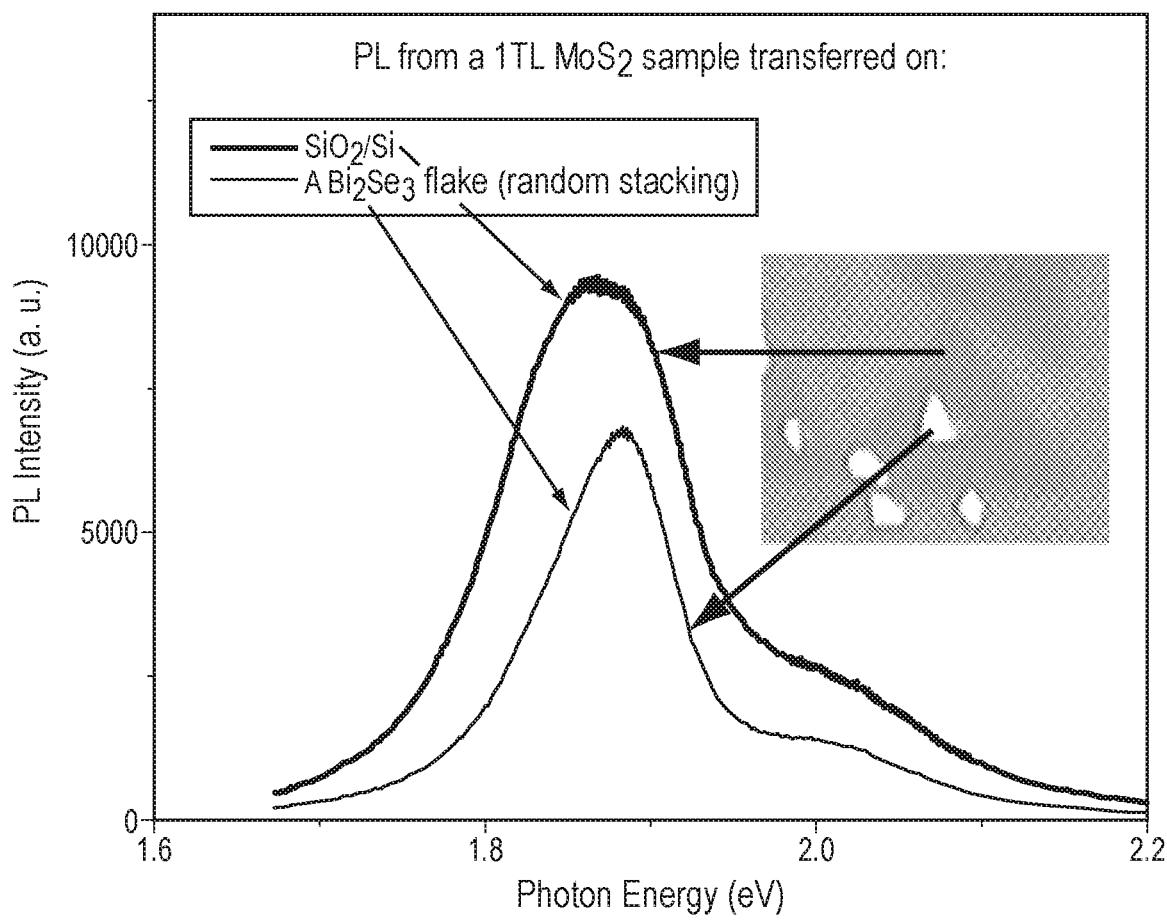
FIG. 10 provides the PL spectrum of 1TL $MoS_2$ film on $SiO_2$/Si and when transferred with a random orientation on a $Bi_2Se_3$ flake, showing the absence of quenching which was shown in FIG. 9.

FIG. 9 shows the PL spectrum of 1TL⊕nQL (n=1-4) samples, compared to that of pristine 1TL MoS$_2$. A dramatic, near-100%, suppression of the PL spectrum of the 1TL⊕1QL sample has been found, which suggests a direct-to-indirect band-gap transition (A. Splendiani, L. Sun, Y. B. Zhang, T. S. Li, J. Kim, C. Y. Chim, G. Galli, F. Wang, Emerging photoluminescence in monolayer MoS$_2$. *Nano Lett.* 10, 1271-1275 (2010)), in agreement with obtained DFT results. Addition of further QLs completely quenches the PL, as shown in the inset to FIG. 9. In order to ascertain whether inter-layer charge-transfer (J. T. Yuan, S. Najmaei, Z. H. Zhang, J. Zhang, S. D. Lei, P. M. Ajayan, B. I. Yakobson, Photoluminescence quenching and charge transfer in artificial heterostacks of monolayer transition metal dichalcogenides and few-layer black phosphorus. *ACS Nano* 9, 555-563 (2015); U. Bhanu, M. R. Islam, L. Tetard, S. I. Khondaker, Photoluminescence quenching in gold-MoS$_2$ hybrid nanoflakes. *Sci. Rep.* 4, 5575 (2014)) could be responsible for the PL suppression, we also performed PL measurements on structures where CVD-grown 1TL MoS2 samples were mechanically transferred (with random position and orientation) onto freshly-cleaved Bi2Se3 layers. FIG. 10 compares the PL spectra from such a "transferred" hetero-layer sample, where only a partial PL modification is observed, suggesting that directly-grown heterocrystal formation is necessary for the observed complete PL suppression. As further discussed below, disrupting the interface alignment of TLs and QLs in the heterocrystals immediately recovers the PL, providing further evidence that the observed PL-suppression is not merely an outcome of thermodynamic charge-transfer—a mechanism that is sometimes responsible for PL-quenching in other heterosystems (J. T. Yuan, S. Najmaei, Z. H. Zhang, J. Zhang, S. D. Lei, P. M. Ajayan, B. I. Yakobson, Photoluminescence quenching and charge transfer in artificial heterostacks of monolayer transition metal dichalcogenides and few-layer black phosphorus. *ACS Nano* 9, 555-563 (2015); U. Bhanu, M. R. Islam, L. Tetard, S. I. Khondaker, Photoluminescence quenching in gold-MoS$_2$ hybrid nanoflakes. *Sci. Rep.* 4, 5575 (2014)). In fact, the charges in heterocrystals appear to redistribute into periodic layers of electrons and holes at the interface in the heterocrystals.

Figure 11:
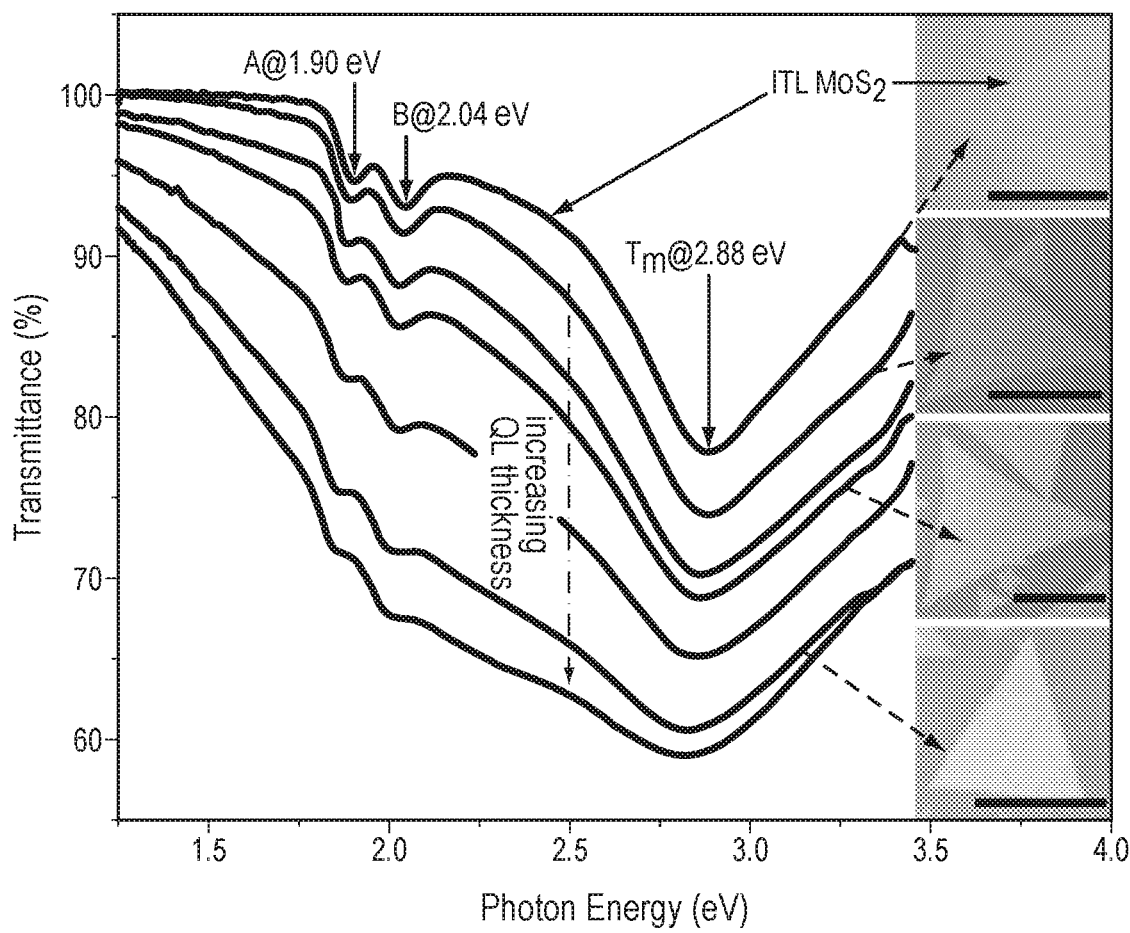
FIG. 11 shows the evolution of energy-resolved optical transmittance in samples of progressively increasing thickness to 6 nm (i.e., 1TL⊕nQL (n=0-5)) with absorption lines A and B, as well as the transmittance minima Tm labelled for the 1TL $MoS_2$ sample.

FIG. 11 shows the energy-resolved optical transmittance (T) of pristine MoS$_2$ and heterocrystals with increasing thickness below 6 nm (corresponding to n=1-5 QL). The highest transmittance curve corresponds to that of 1TL MoS$_2$, with dips at 1.9 and 2.04 eV, corresponding to the formation of A and B excitons from the two spin-orbit-split edges of the valence band at the K points. This is followed by a gradual decrease in transmittance with increasing energy ending in a broad transmittance valley centered around the lowest transmittance (Tm) at 2.88 eV, possibly associated with degenerate exciton states near the Γ-point. The broadband absorbance between ≈1.9-2.9 eV has been proposed to arise from strong electron-phonon effects that smear out several higher order excitonic peaks within this region (D. Y. Qiu, F. H. da Jornada, S. G. Louie, Optical Spectrum of MoS$_2$: Many-body effects and diversity of exciton states. *Phys. Rev. Lett.* 111, 216805 (2013)). With increasing QL-thickness, there is a steady decrease in transmittance over the entire region of the measured spectra. Note that although the PL of these samples is completely quenched, the dip-like A- and B-excitonic features in the transmittance spectra are retained, suggesting that these excitons can survive in the heterocrystals even though the material as a whole becomes an indirect-gap system.

The transmittance data also reveals a significant red-shift of transmittance spectral weight below the exciton energy values with increasing QLs. Although increased reflectance is evident (changing sample contrast in inset of images of FIG. 11) with growing QLs, it was not possible to estimate the percentage of light reflected (R) or absorbed (A) by the crystals under microscope-based measurements. However, since T(%)=100−{R(%)+A(%)}, and both A and R depend on the density of states, the decreasing transmittance values and the comparatively larger drop in spectral transmittance at lower energy values (with increasing number of QLs) suggest that energy-ranges below the excitonic dips are now also occupied by electronic bands with a steady increase in the heterocrystal density of states near the Fermi level. From these curves, approximate transmittance edges of the heterocrystals could be estimated using a modified Tauc plot approach. A clear, monotonically decreasing thickness dependence of transmittance-edge values is observed in the heterocrystals, ranging from ≈1.1→0.75 eV, saturating at the higher thickness values. These values are consistent with all PL spectra of heterocrystals which show no detectable indirect peak above 1.2 eV (detection limit of the used PL spectrometer). These values are significantly distinct from the energy gaps in either of the participating parent crystals.

Figure 12:
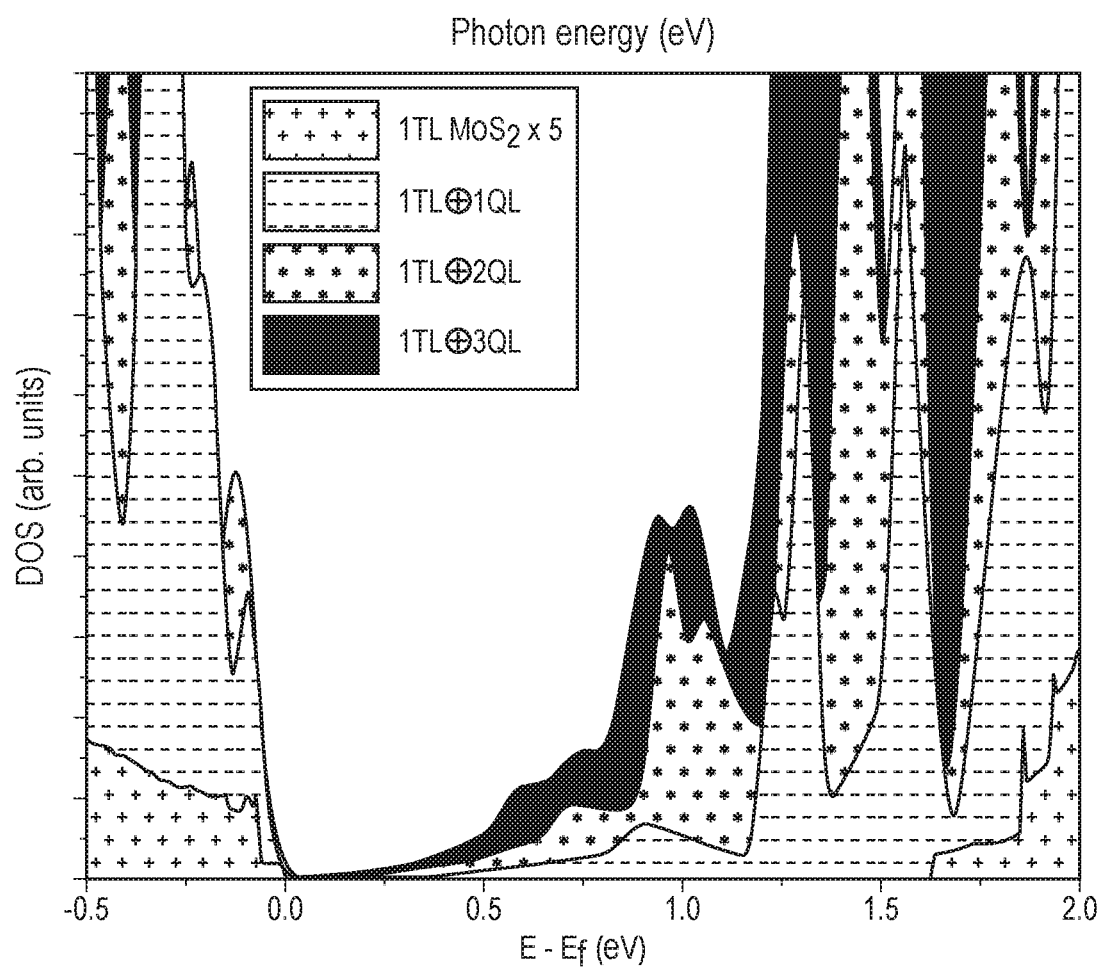
FIG. 12 is a plot of DFT DoS of 1TL⊕nQL (n=0-3) ($MoS_2$ and $Bi_2S_3$) heterocrystals, showing that the DoS spectral weight near the bottom of conduction band shifts to lower energies as QL thickness increases.

The obtained DFT density of states (DoS) of 1TL $MoS_2$ and representative heterocrystals are plotted in FIG. 12, which shows that as QL thickness increases, the DoS spectral weight near the bottom of conduction band also shifts to lower energies, which is in excellent agreement with the experimental observation of red-shift of transmittance spectral weight with increased QL thickness. Detailed analysis of A and B excitons in the heterocrystals also reveals gradual decrease in peak-amplitude and peak-shift towards lower energies (red-shift) with increasing QL thickness. Thus, it is believed, that heterocrystal formation is indeed responsible for giving rise to several fundamentally new and functionally attractive observed electronic and optical properties.

Reconfigurability

Figure 13:
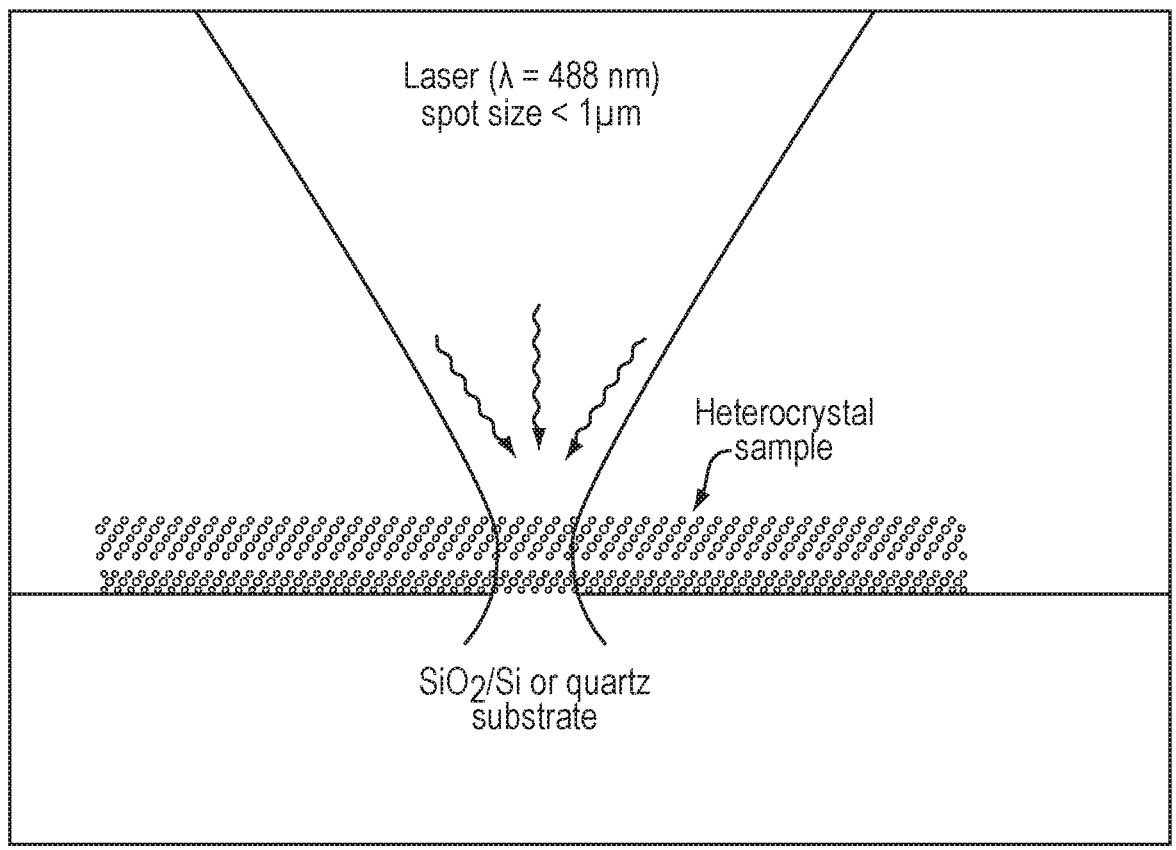
FIG. 13 provides a schematic depiction of a laser-treatment procedure: exposure of a ($MoS_2$ and $Bi_2S_3$) heterocrystal to a focused laser spot (I=76 $\mu W/\mu m^2$).
Figure 14:
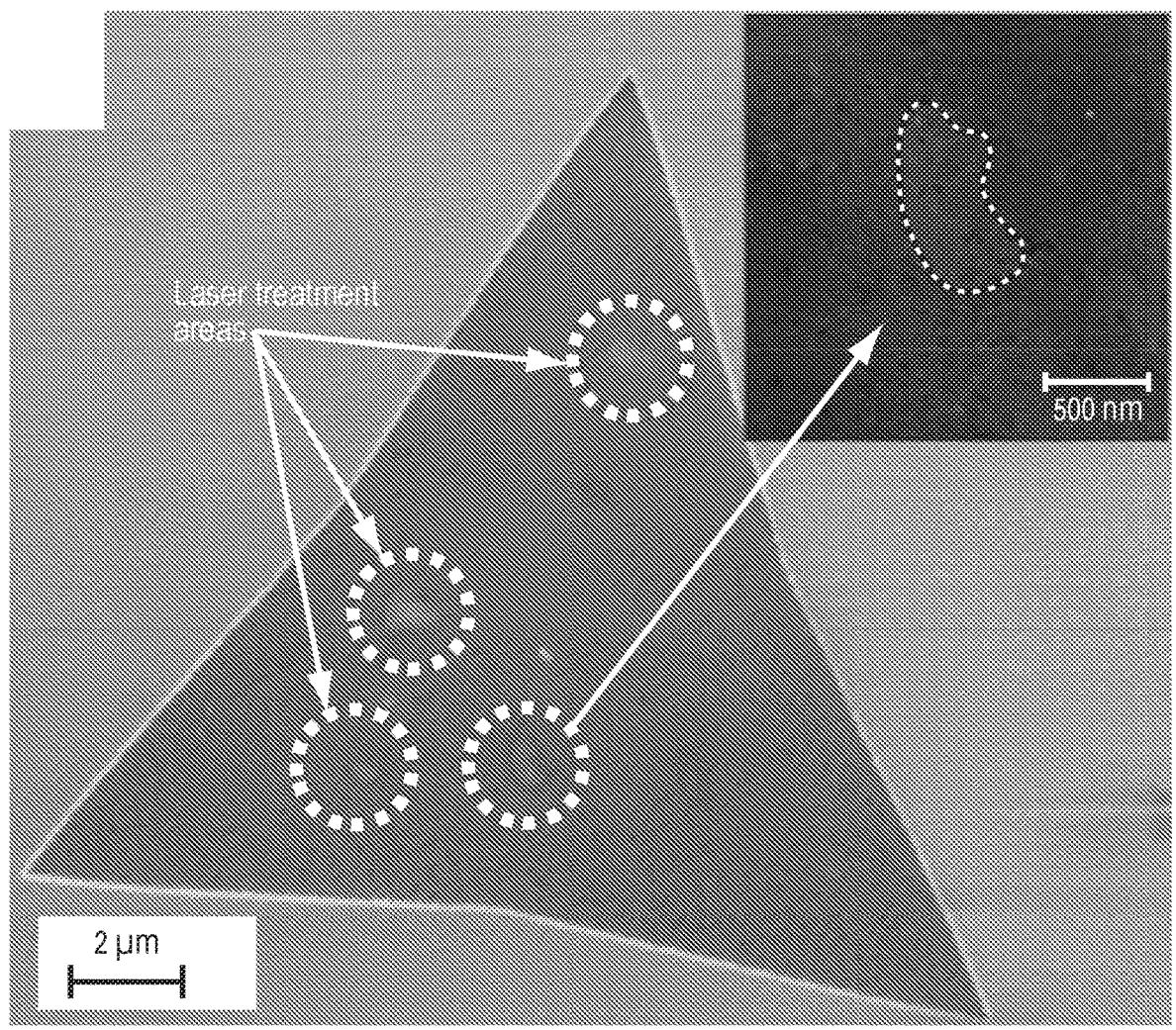
FIG. 14 provides a SEM image showing laser-treated areas (lighter contrast) on a ($MoS_2$ and $Bi_2S_3$) heterocrystal, with the inset showing an AFM image of one of the treated spots.
Figure 15:
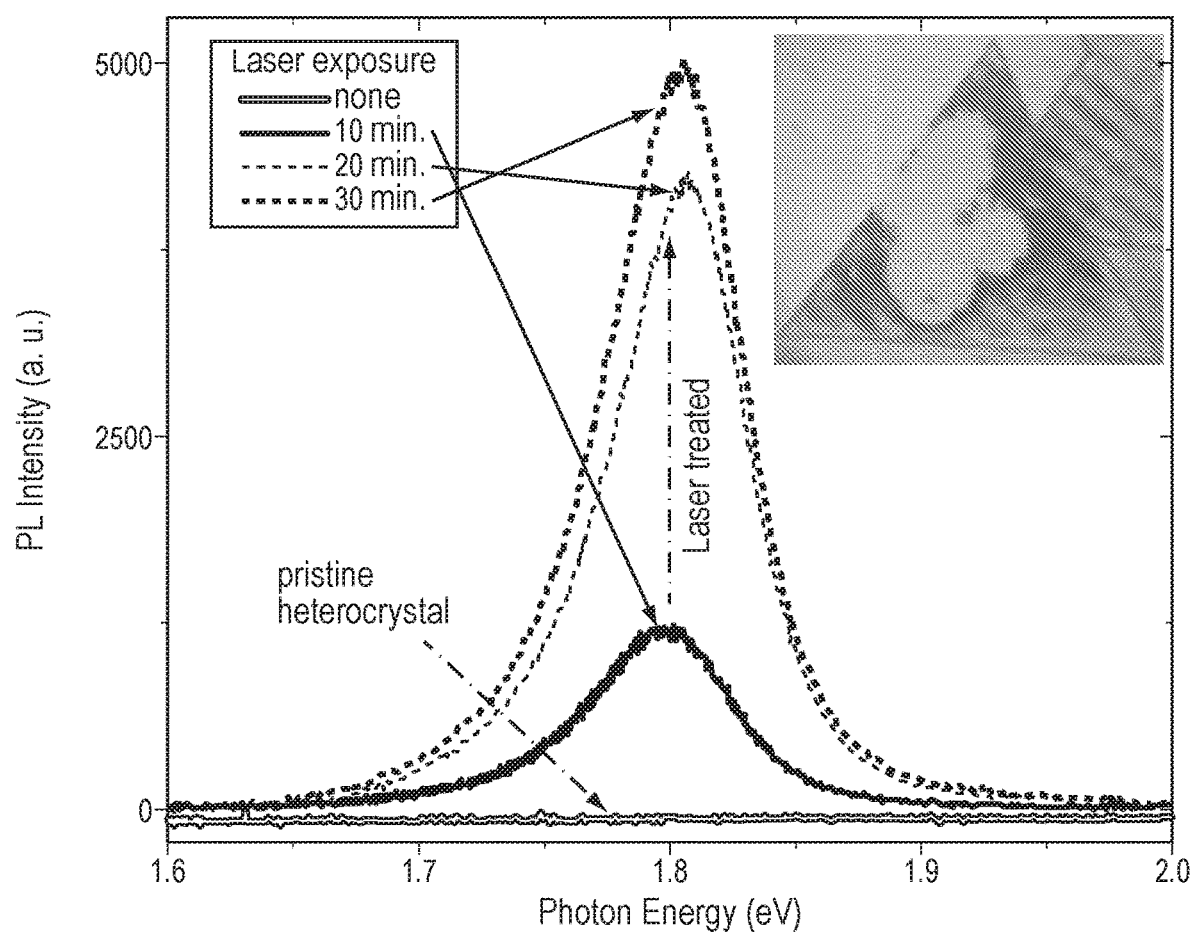
FIG. 15 provides a graph of PL intensity over photon energy, which shows that laser treatment results in the recovery of 1TL $MoS_2$-like photoluminescence in a ($MoS_2$ and $Bi_2S_3$) heterocrystal, shown as a function of exposure time.
Figure 16:
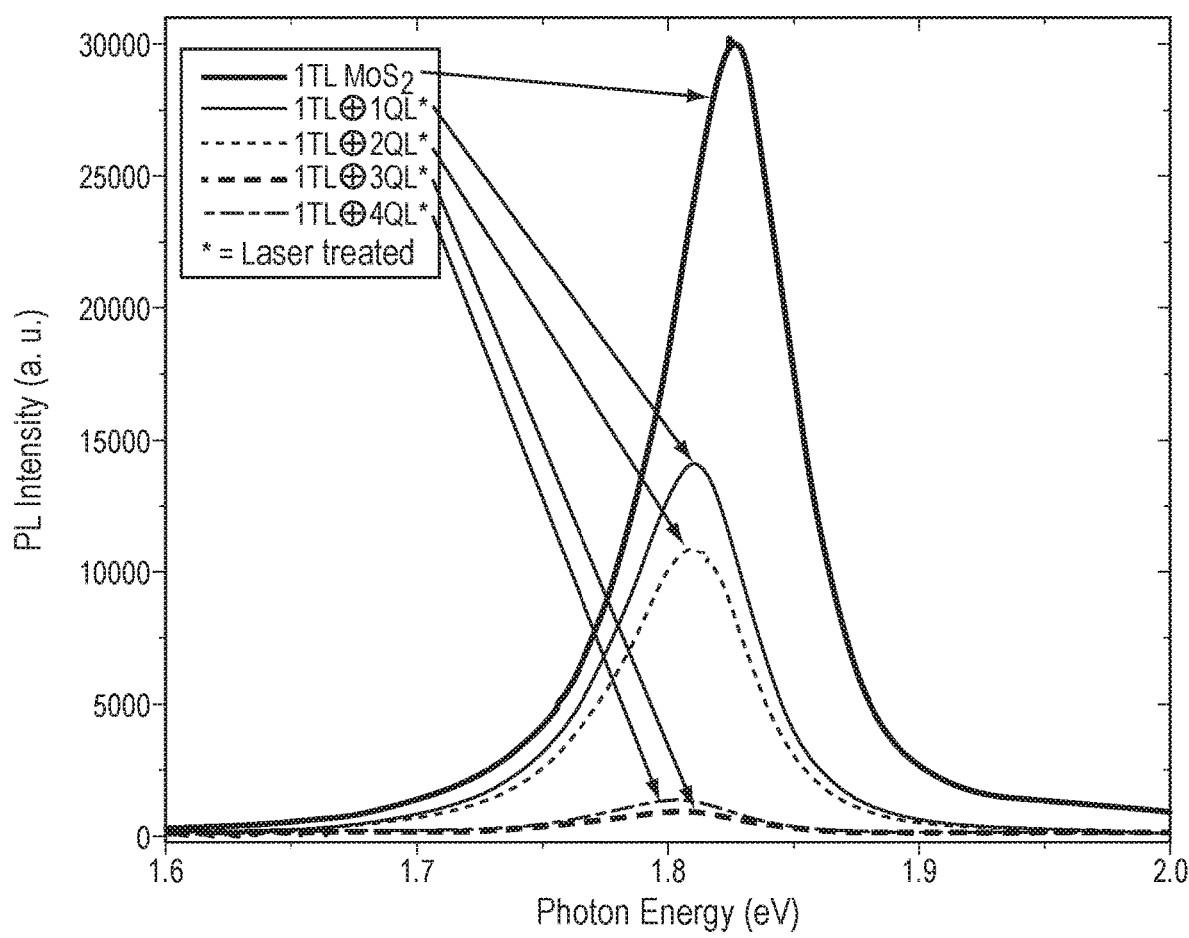
FIG. 16 provides a graph of PL intensity over photon energy, which shows that laser treatment results in the recovery of 1TL $MoS_2$-like photoluminescence in a ($MoS_2$ and $Bi_2S_3$) heterocrystal, shown as a function of samples of different QL-thickness.

It was discovered that application of a high-intensity laser spot on the heterocrystals results in nearly complete reversal of their optical properties. FIG. 13 schematically depicts the laser treatment process used on a heterocrystal sample supported on a substrate. Typically, samples were exposed to a 488 nm laser focused onto a spot size down to <1 μm with 76 μW/μm$^2$ intensity. FIG. 14 shows an SEM image of a sample which has been exposed to spots of various sizes, the affected areas of which are highlighted. The inset in FIG. 14 is an AFM topographic image of one of the "treated" spots, denoted by the sub-micrometer outlined area. The laser-treated area typically undergoes a small increase in height and surface roughness suggesting that the laser treatment is not "etching/sublimating out" the materials, but possibly induces structural changes, while the lighter SEM contrast suggests modified electronic properties. Indeed, the most spectacular outcome of the laser treatment is the recovery of the $MoS_2$ PL peak. FIG. 15 summarizes this rather surprising result, where a sample was laser treated for various time intervals. A strong PL peak (measured using low-intensity laser) is recovered at nearly the same photon energy as that of the parent 1TL $MoS_2$ crystal, indicating that the laser treatment results in the reverting of the electronic structure to that of a pristine monolayer $MoS_2$. In addition to the PL recovery, prolonged laser treatment of the heterocrystals results in complete change of their color as seen in the optical image inset in FIG. 15, further indicating the dramatic change in their electronic properties. PL spectra were measured also in samples of different QL-thicknesses after identical, 10-min laser treatment (FIG. 16). The degree of PL recovery was found to be inversely related to the QL-thickness, confirming that most of the changes observed occurred in the Bi2Se3 region. As discussed below, the recovered PL slightly red-shifted compared to the pristine PL, possibly because the $Bi_2Se_3$ layers were still attached to the $MoS_2$ layer.

Figure 17:
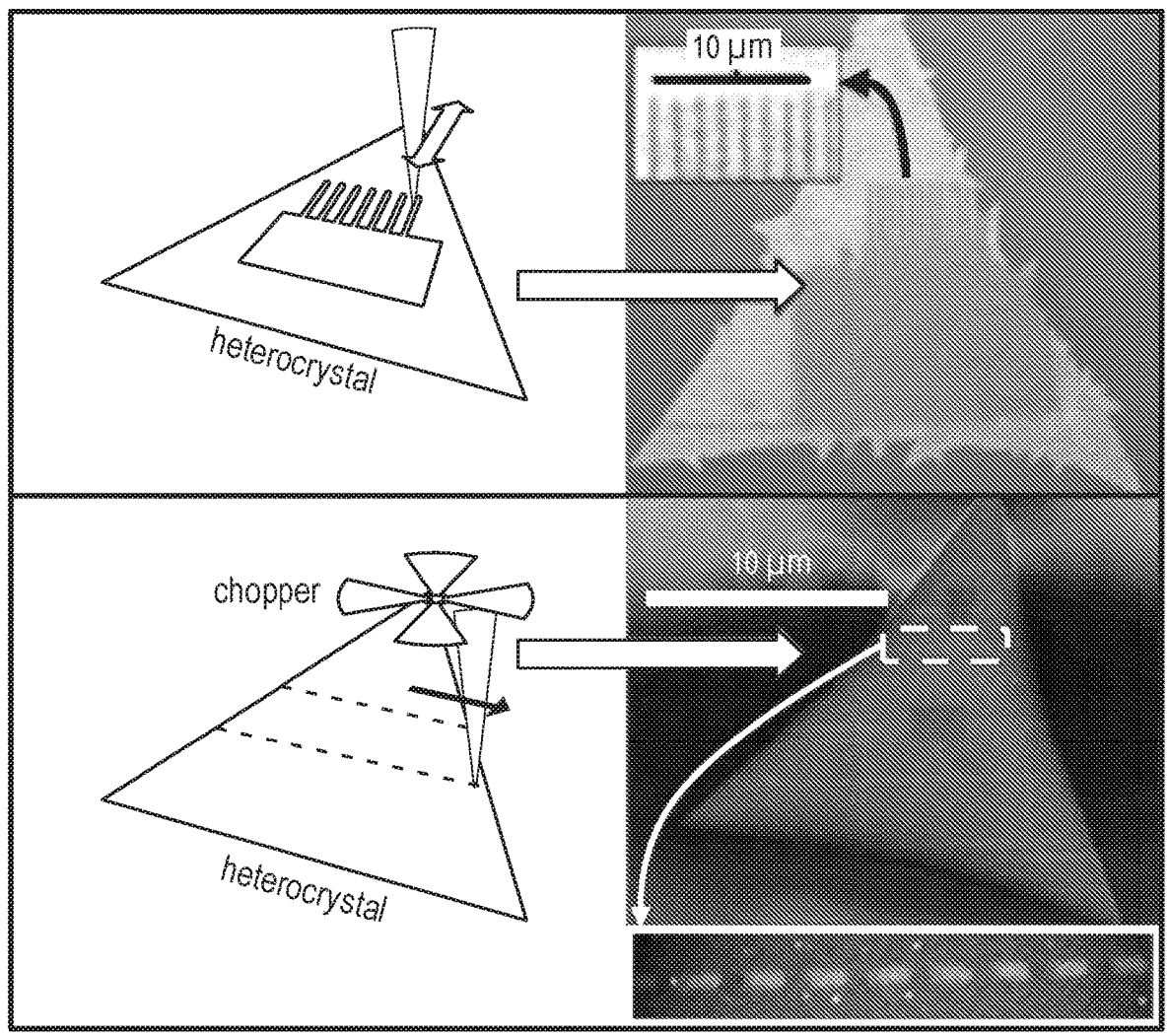
FIG. 17 illustrates 2D-materials by design: Top panel: schematic and optical image of a laser-written ($MoS_2$ and $Bi_2S_3$) heterocrystal showing a rectangular "window" and an array of lines drawn with sub-micron spatial resolution. Bottom panel: An SEM image of a ($MoS_2$ and $Bi_2S_3$) heterocrystal exposed to an optically-chopped moving laser, intended to represent an alternating sequence of 1's and 0's for an optical storage device.
Figure 18:
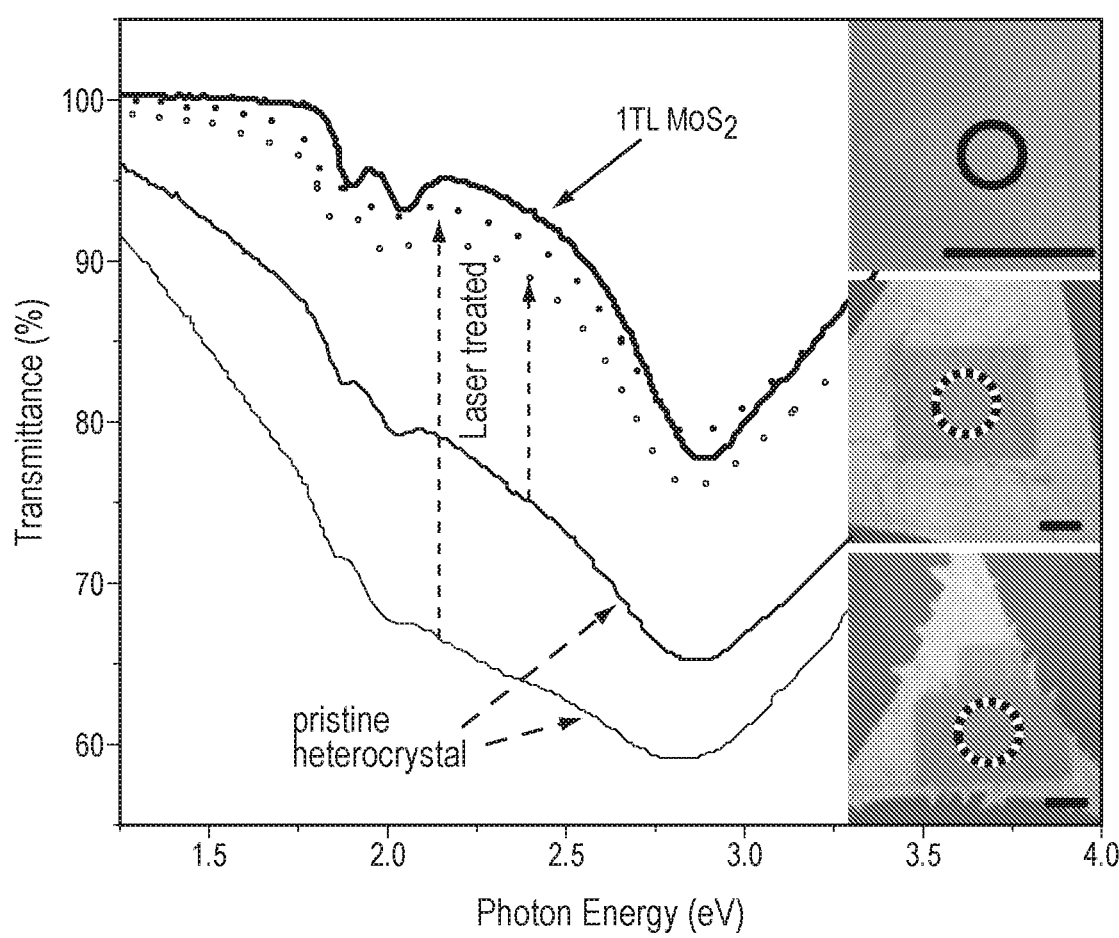
FIG. 18 provides a graph of transmittance over photon energy and specifically the variation of energy-resolved transmittance before and after laser treatment in the ($MoS_2$ and $Bi_2S_3$) heterocrystals. The insets show optical images of a 1TL $MoS_2$ and two post-laser-written heterocrystals with different thicknesses, from which the spectra were collected, before and after the laser treatment; showing that a near-complete recovery to pristine-$MoS_2$-like behavior is obtained in the post-treated samples.

Using the sub-micrometer-resolution laser treatment 2D heterocrystal sheets with laser-patterned/written optical/electronic properties were prepared. FIG. 17 shows two such examples: in the top panel, a moving laser spot was used to define rectangular windows and arrays of parallel lines on the 2D heterocrystals with modified properties. Such laser-written patterns are highly attractive for optoelectronic circuits or photonic/plasmonic crystals. In the bottom panel, a moving laser spot was periodically chopped to mimic "bit-writing" where the alternating sub-micrometer "laser-treated, light-emitting" and "pristine, dark" regions could code 1's and 0's, respectively. This represents a new way of optical information storage in atomically-thin materials. FIG. 18 shows the spectral transmittance curves of two heterocrystals before and after laser treatment along with that of pristine 1TL $MoS_2$. Post-treatment, the transmittance curves of the heterocrystals look strikingly similar to those of 1 TL MoS2 over the entire spectrum of energies tested, suggesting that the laser treatment results in near-complete reversal of band structure to that of pristine 1TL $MoS_2$. Indeed, similar recovery was also observed in Raman spectroscopy after laser treatment for $A^1_g$ (~385 cm$^{-1}$), $E^1_{2g}$ (~405 cm$^{-1}$) and 2LA(M) modes (450-460 cm-1). Moreover, by annealing the laser-treated samples at 175° C. in argon environment, partial PL quenching and recovery was repeated a few times, proving that the "reconfiguration" is reversible.

Figure 19A:
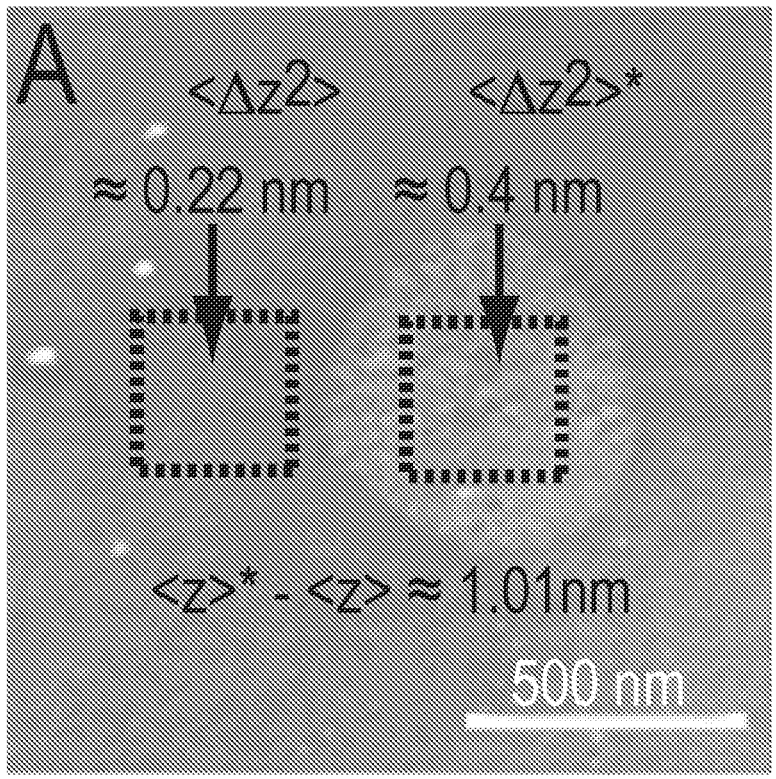
FIG. 19A provides an AFM topography image comparing the surface morphology of pristine vs. laser-treated areas in few-nanometer-thick ($MoS_2$ and $Bi_2S_3$) heterocrystal, providing that both rms surface roughness as well as the mean height of the laser-treated (denoted with a "*") areas are slightly greater than those of pristine areas.
Figure 19B:
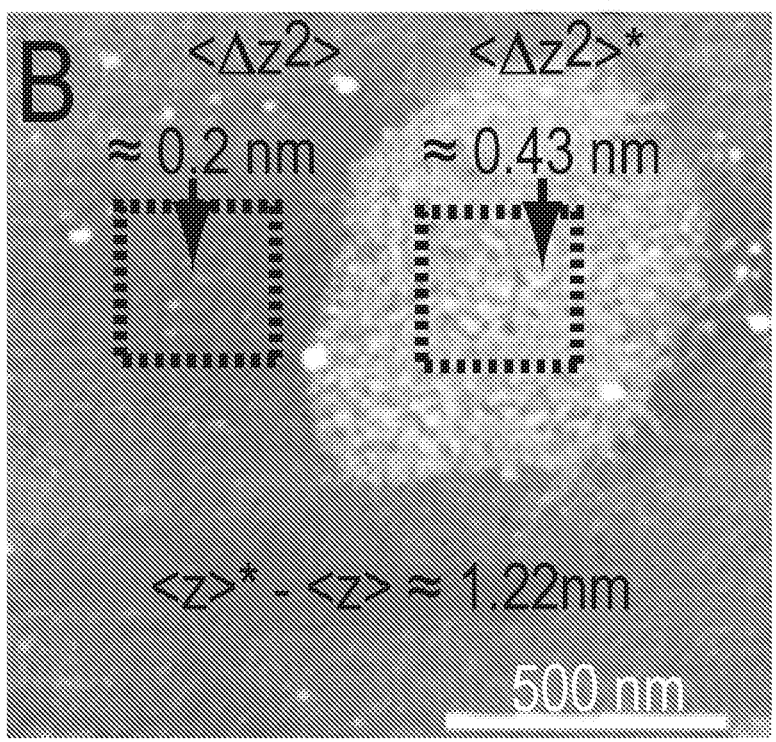
FIG. 19B provides an AFM topography image comparing the surface morphology of pristine vs. laser-treated areas in few-nanometer-thick ($MoS_2$ and $Bi_2S_3$) heterocrystal, providing that both rms surface roughness as well as the mean height of the laser-treated (denoted with a "*") areas are slightly greater than those of pristine areas.

FIG. 19A shows an AFM image of two laser-treated areas of a 1TL⊕3QL heterocrystal. FIG. 19B shows an AFM image of two laser-treated areas of another 1TL⊕3QL heterocrystal having the same thickness as the heterocrystal shown in FIG. 19A. Analysis of the surface heights reveals that the laser-treated areas have a slightly greater mean height as well as surface-roughness, indicating that the material under the laser spot has become more uneven or granular. FIGS. 19A and 19B demonstrate the consistency of the change in height and roughness. FIGS. 20A and 20B show optical and TEM images of another heterocrystal sample, part of which was laser treated, as shown. Higher magnification TEM images from representative regions of this crystal reveal that while the pristine heterocrystal retains its planar, homogenous topology (FIG. 20C), spatially distinct nanoscale domains appear in the laser-treated sample (FIG. 20D), consistent with the granular morphology observed in AFM measurements. SAED patterns from each of these regions confirm that while rotational orientation of the $Bi_2Se_3$ and $MoS_2$ patterns remain aligned in the pristine heterocrystal (FIG. 20E), the $Bi_2Se_3$ layer breaks into smaller domains and undergoes small rotations relative to the original $MoS_2$ orientation, resulting in multiple, closely-rotated patterns in the laser-treated regions (FIG. 20F). It appears that the laser treatment provides sufficient energy to the $Bi_2Se_3$ layer to break down into smaller nanoscale domains, and detach them from the $MoS_2$ TL sufficiently to rotate away from their original direction. While these nanodomains of Bi2Se3 retain their crystal structure (as evident from the strong diffraction patterns), breakdown of rotational alignment results in the heterocrystals losing their electronic identity. The underlying $MoS_2$ TL hence regains its PL and other optical properties.

Figure 21:
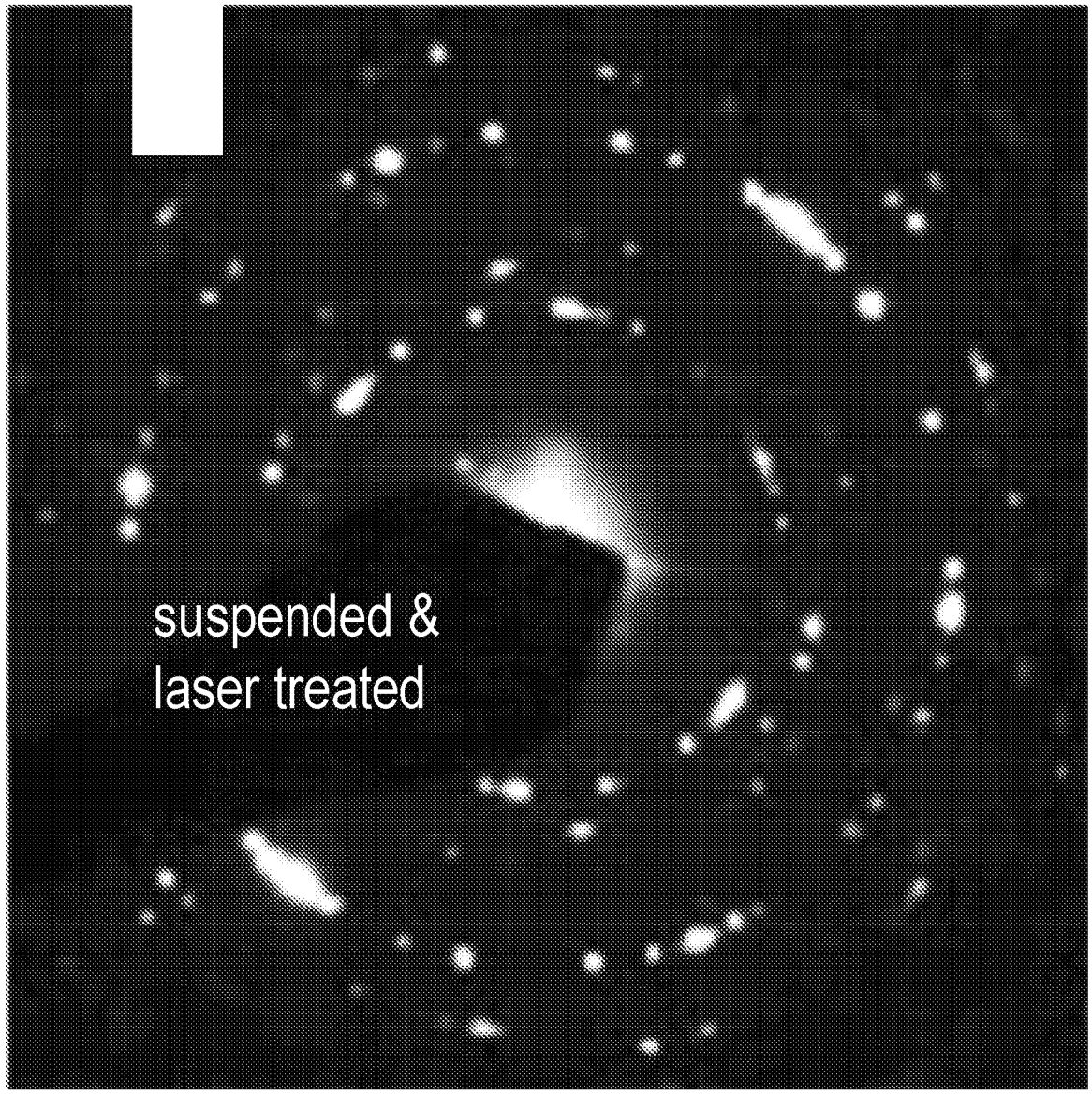
FIG. 21 provides a typical SAED of laser-treated, suspended ($MoS_2$ and $Bi_2S_3$) heterocrystals, revealing rotational reorientation and spread of both $Bi_2Se_3$ and $MoS_2$ crystals, suggesting that both form polycrystalline nano-domains.
Figure 22:
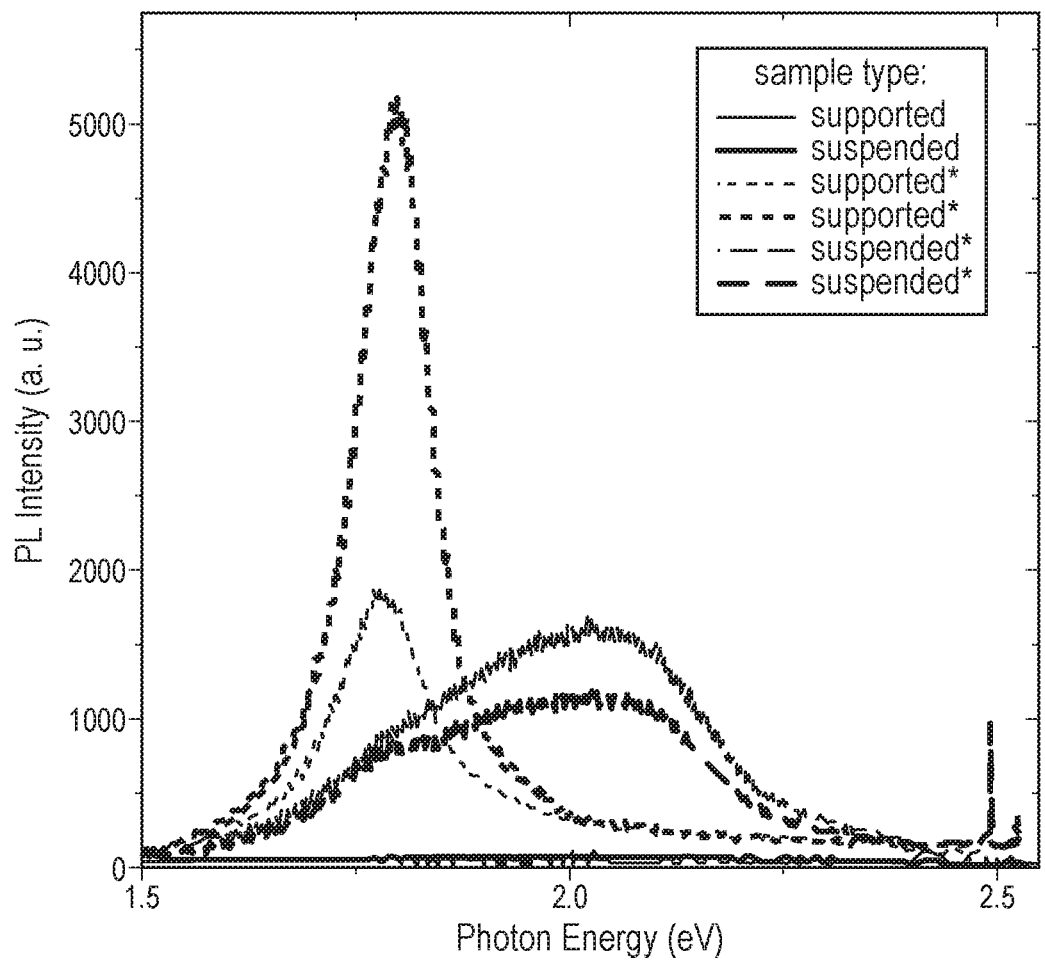
FIG. 22 shows PL intensity over photon energy in a sample (similar to the samples of FIG. 20 and FIG. 21) before and after (denoted with a "*") laser treatment: Laser treatment in suspended samples is seen to result in a characteristic broad-band PL, different from the sharply-defined PL of supported samples.

The crystallographic and optical modifications are even more dramatic when the laser treatment is performed on "suspended" heterocrystals. The $Bi_2Se_3$ as well as $MoS_2$ layers appear to break down into smaller domains with a range of rotational orientations, resulting in ring-like patterns characteristic of polycrystalline samples, as seen in the SAED pattern in FIG. 21. Additional diffraction rings appear in-between the patterns formed by the $Bi_2Se_3$ and $MoS_2$ layers, corresponding to lattice spacings ranging from 3.54-3.57 Å, which is consistent with the spacing between (201) planes of orthorhombic $Bi_2S_3$ (51), indicating the possible formation of this phase within the laser-treated region. Very interestingly, these regions are optically characterized by a broadband PL spectrum ranging over ~1.7 to 2.2 eV, as seen in FIG. 22. This response is very unlike the PL emission from the 1TL $MoS_2$ or from laser-treated substrate-supported samples (shown in the same graph for comparison).

Figure 23:
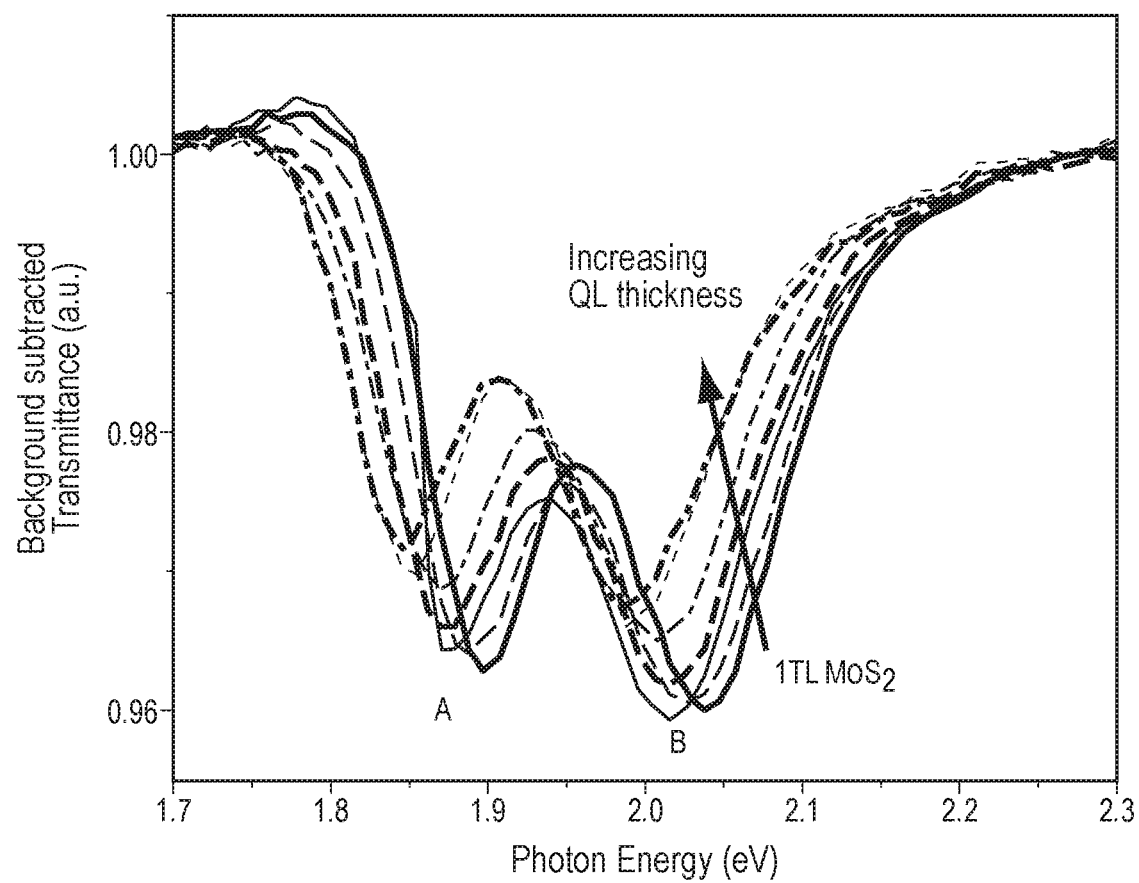
FIG. 23 provides a background-subtracted excitonic "dips" in transmittance spectra of ($MoS_2$ and $Bi_2S_3$) heterocrystals showing gradual decrease in amplitude and gradual red-shift in position.

Variation of optical properties of the heterocrystals as a function of layer-thickness and laser-treatment revealed a number of interesting features. In pristine $MoS_2$, the A and B excitons are both known to be localized at the valence-band peaks at the K and K'-points of the first Brillouin zone (D. Y. Qiu, F. H. da Jornada, S. G. Louie, Optical Spectrum of $MoS_2$: Many-body effects and diversity of exciton states. Phys. Rev. Lett. 111, 216805 (2013)). FIG. 23 shows a close-up of the associated excitonic "dips" obtained after a polynomial background subtraction from the transmittance curves of FIG. 11. In going from pure monolayer $MoS_2$ to the indirect band gap heterocrystals, the excitonic dips are seen to systematically become somewhat smaller and red-shifted. This behavior is remarkably similar to the manner in which excitonic peaks evolve with increasing layer thickness in pure 2D-$MoS_2$ samples, (K. P. Dhakal, D. L. Duong, J. Lee, H. Nam, M. Kim, M. Kan, Y. H. Lee, J. Kim, Confocal absorption spectral imaging of $MoS_2$: optical transitions depending on the atomic thickness of intrinsic and chemically doped $MoS_2$. Nanoscale 6, 13028-13035 (2014)) even though the related valence-band peaks shift gradually away from the Fermi level (J. E. Padilha, H. Peelaers, A. Janotti, C. G. Van de Walle, Nature and evolution of the band-edge states in $MoS_2$: From monolayer to bulk. Phys. Rev. B 90, 205420 (2014)). By projecting the states with $MoS_2$ and $Bi_2Se_3$ characters, our first-principles computations show that the valence band peaks and their nearly-pure $MoS_2$ character is retained at the K and K' points with increasing number of QLs in the heterocrystals, some mixing with $Bi_2Se_3$ bands notwithstanding. These results indicate that the effective electronic interactions between $MoS_2$ and $Bi_2Se_3$ layers in the heterocrystals are similar in strength to those between pure $MoS_2$ layers, despite mismatch between the lattice parameters. Notably, red-shift in the excitonic peaks in both $MoS_2$ and our heterocrystals reflects the effects of a decreasing band gap energy with an increasing number of layers and the associated changes in the screening environment at K and K'.

Figure 24:
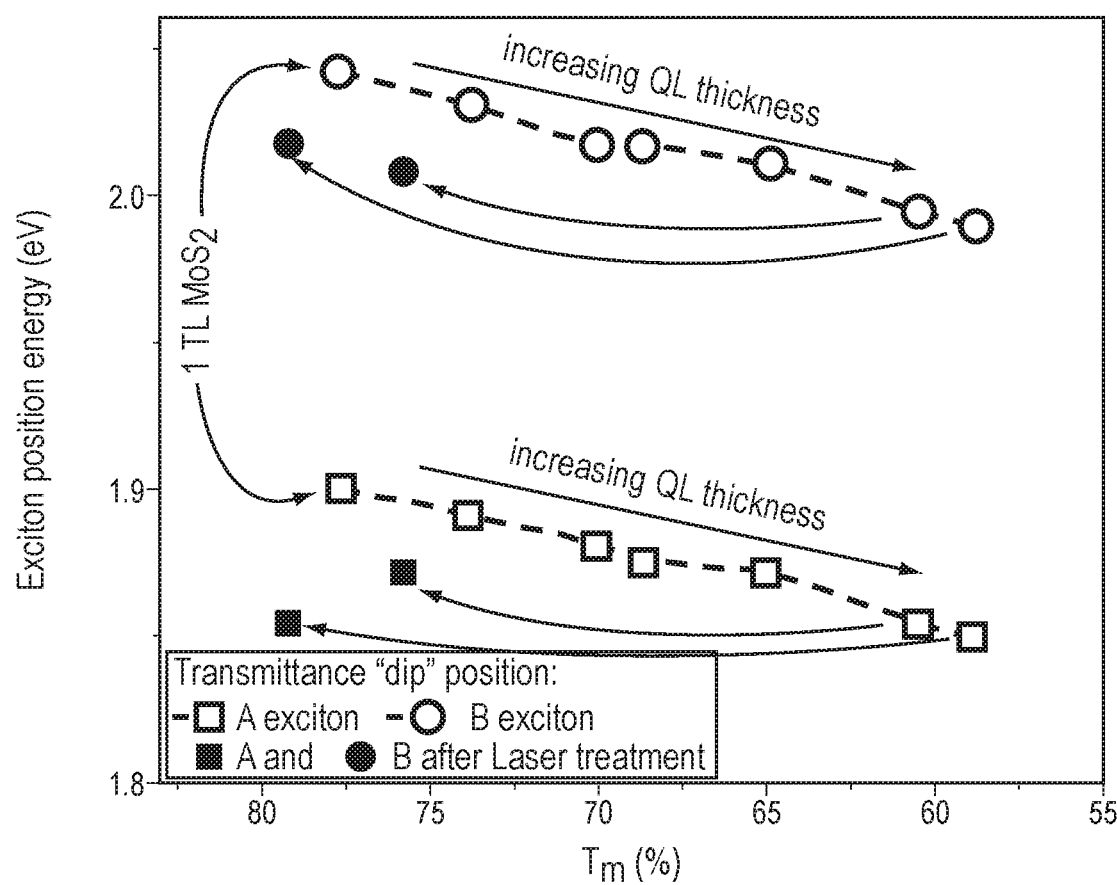
FIG. 24 shows the variation of the A and B excitonic positions with growing sample thickness (straight arrows) of ($MoS_2$ and $Bi_2S_3$) heterocrystals, and after laser treatment (curved arrows).
Figure 25:
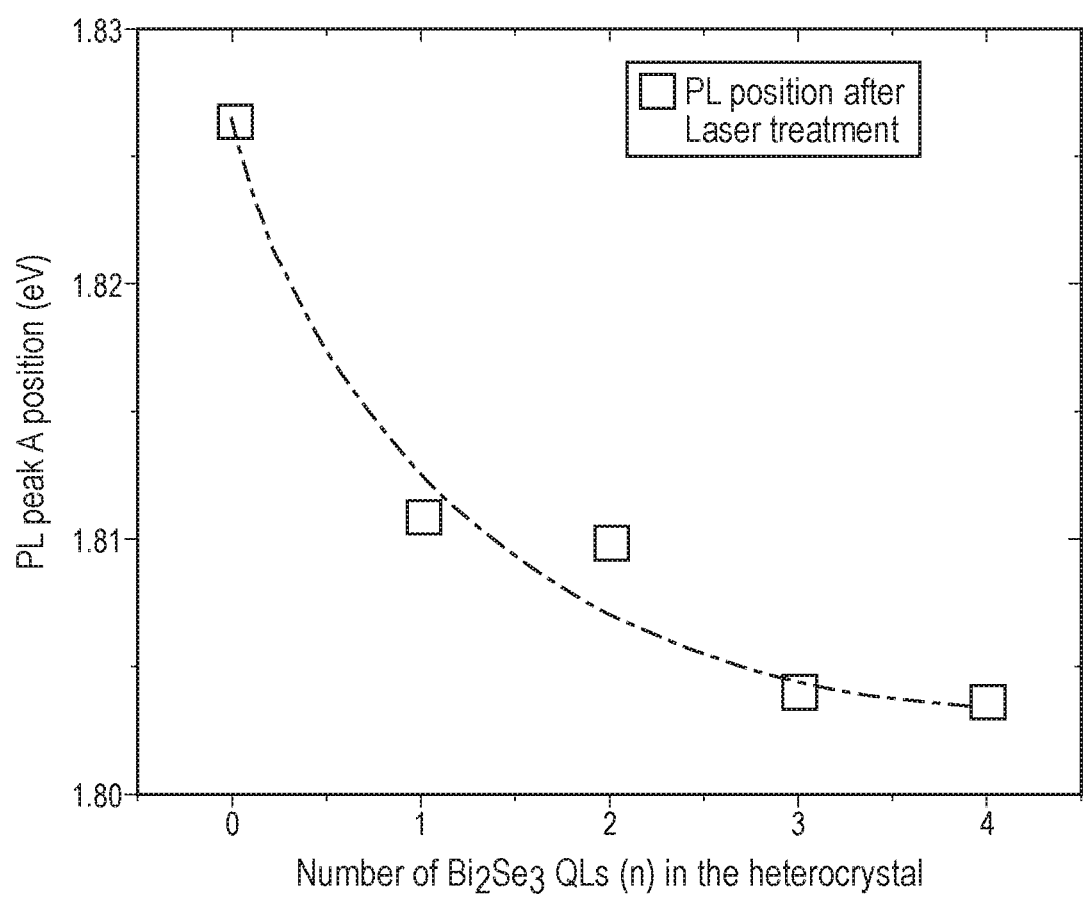
FIG. 25 shows the variation of the excitonic A-peak position as a function of layer thickness of ($MoS_2$ and $Bi_2S_3$) heterocrystals.

As mentioned earlier, (FIGS. 19A and 19B), a slight increase in sample height after laser-treatment was observed. This could partially reflect the fact that the average height of a rough surface appears larger than a flat surface, since a continuous sheet of material redistributes into small grains (even smaller than the AFM tip-size) of increased heights. On the other hand, the increased height of laser-treated $Bi_2Se_3$ could potentially also indicate a certain degree of delamination of the $Bi_2Se_3$ from the $MoS_2$ layer. The obtained data was analyzed to understand which of these two effects is more dominant. While the laser-treatments recover the transmittance curve shapes, it was found that positions of the excitonic "dips" continue to be red-shifted by about 30-45 meV post laser-treated recovery (FIG. 24). Similarly, the post-laser-treated PL peaks remain red-shifted by 20-25 meV from that of pristine $MoS_2$, see FIG. 25. As discussed earlier, these peak-shifts are associated with the immediate dielectric environment of the excitons. In other words, the red-shifted excitonic features post laser-treatment (transmittance and PL) appear to indicate that the $Bi_2Se_3$ layers were still physically adhered to $MoS_2$ and provide a modified dielectric environment, despite their rotational rearrangement. These observations, in addition to the absence of any diffraction patterns (other than pure rotational spots), suggest that post laser-treatment, formation of randomly-oriented nano-grains that remain attached to the $MoS_2$ surface is the more dominant reason for PL, transmittance, and laser recovery.

Figure 26:
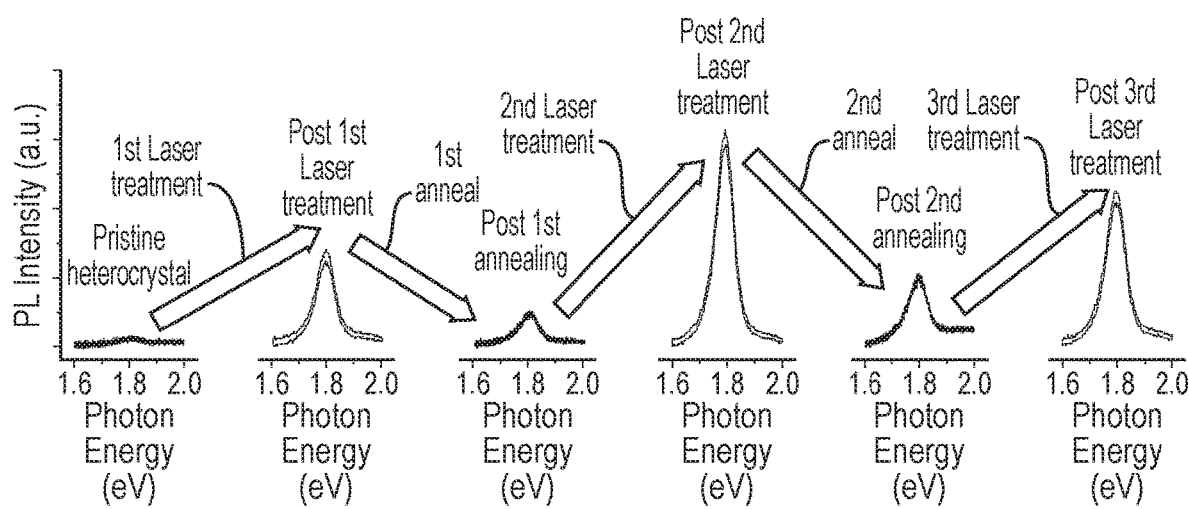
FIG. 26 shows the variation of PL peak-intensity for a heterocrystal of $MoS_2$ and $Bi_2Se_3$ (under identical illumination conditions) under repeated laser-treatment and annealing cycles, and shows that at least partial recovery is observed with every annealing cycle, representing repeatable "reconfigurable" properties.

Additionally, it was found that the PL quenching and recovery, when measured from the same spot of a heterocrystal can be partially repeated through annealing of the laser-treated samples as shown in FIG. 26. SAED patterns measured from laser-treated areas before and after the annealing process reveal the remarkable fact that upon annealing, the $Bi_2Se_2$ sub-lattice almost completely recovers its original rotational alignment with respect to the $MoS_2$ crystal. This provides clear evidence that annealing of the samples results in rotational re-alignment and re-formation of the heterocrystals, and recovery of their pristine (pre-laser-treated) properties including the re-quenching of the PL. This demonstrates reconfigurable interface-engineering with a functionally attractive outcome in atomically-thin materials, which makes the present heterocrystals attractive for re-writable optical storage devices.

Materials and Methods

Growth of MoS2-$Bi_2Se_3$ Heterocrystals $MoS_2$ substrates were grown using CVD. The growth setup consisted of 1 inch diameter quartz tubes in a horizontal tube furnace (Lindberg/Blue M). A quartz boat, containing a thin 3 mg $MoO_2$ powder layer with $SiO_2$/Si or polished quartz (MTI Corporation) substrates suspended over the powder with the growth side facing down, was placed in the hot center of the furnace. 150 mg sulfur powder was placed near the insulating edge of the furnace upstream. The setup was pumped down and purged with argon gas before being filled with an Ar atmosphere. Downstream was then opened to atmosphere in addition to a constant 200 sccm Ar flow. The furnace was heated at a rate of 50° C./min to 780° C., and then held there for 15-25 minutes. After the elapsed time, the furnace was opened and allowed to cool rapidly.

$Bi_2Se_3$ growth was performed in an identical CVD setup. 50 mg of $Bi_2Se_3$ powder was placed in the hot center of the furnace. The $MoS_2$ substrate was placed downstream 14-16 cm to a temperature range of 315° C. to 290° C., respectively. The system was pumped down to a base pressure of ~10 mTorr before a 20 sccm Ar flow was introduced, raising the growth pressure to ~350 mTorr. The furnace was heated at a rate of 50° C./min to 480° C., and then held there for 10-20 minutes depending on desired thickness. Once growth was completed, the furnace was opened and allowed to cool rapidly.

Instrumentation

Raman and PL spectra were measured using a Renishaw Raman microscope equipped with a 488 nm laser and 1800 l/mm grating. A 100× objective focused the laser to diffraction-limited spot size. TEM images and SAED patterns were collected from a JEOL 2010F operated at 200 kV. AFM images were taken from a NanoMagnetics Instrument Ambient AFM. Transmittance spectra of individual heterocrystals were measured by a custom-built UV/Vis absorption microspectrometer. Monochromatic light from a monochromator (200 nm-1000 nm) was focused by a 50× objective and chopped at 200 Hz. The power was attenuated below 10 µW to avoid additional effects. All Raman, PL, AFM and UV/Vis experiments were performed under ambient condition.

DFT Computational Details

The ab-initio calculations were performed using the pseudopotential projected augmented wave method (G. Kresse, D. Joubert, From ultrasoft pseudopotentials to the projector augmented-wave method. Phys. Rev. B 59, 1758-1775 (1999)) implemented in the Vienna ab initio simulation package (VASP) (G. Kresse, J. Furthmuller, Efficient iterative schemes for ab initio total-energy calculations using a plane-wave basis set. *Phys. Rev. B* 54, 11169-11186 (1996); G. Kresse, J. Hafner, Ab-Initio molecular-dynamics for open-shell transition-metals. *Phys. Rev. B* 48, 13115-13118 (1993)) with an energy cutoff of 420 eV for the plane-wave basis set. Exchange-correlation effects were treated using the generalized gradient approximation (GGA) (J. P. Perdew, K. Burke, M. Ernzerhof, Generalized gradient approximation made simple. *Phys. Rev. Lett.* 77, 3865-3868 (1996)) and vdW corrections were included using the method of Grimme (DFT-D2) (S. Grimme, Semiempirical GGA-type density functional constructed with a long-range dispersion correction. *J. Comput. Chem.* 27, 1787-1799 (2006)), where a 7×7×1 F-centered k-point mesh was used to sample the Brillouin zone. The stacking spacing and band gap were further studied using the new SCAN meta-generalized gradient approximation scheme (SCAN meta-GGA) (J. W. Sun, A. Ruzsinszky, J. P. Perdew, Strongly constrained and appropriately normed semilocal density functional. *Phys. Rev. Lett.* 115, 036402 (2015)), and we found the same trends as with GGA-PBE. A large enough vacuum of 15 Å in the z-direction was used to ensure negligible interaction between the periodic images of the films. All the structures were relaxed using a conjugate gradient algorithm with the atomic force tolerance of 0.05 eV/Å and the total energy tolerance of 10−4 eV. The spin-orbit coupling effects were included in a self-consistent manner.

Annealing Experiments on Heterocrystals

The PL of the samples were first measured on as-grown heterocrystals. The samples were then laser treated for 90 seconds and the low-power PL was measured again. After the region where the laser treatment was performed was identified with respect to markers on the substrate, the samples were then annealed in pure argon (flowing at a rate of 2 ml/min) at 175° C. overnight. After annealing, low-power PL was measured at the same locations as before. The cycle was then repeated.

2D Heterocrystals Obtained by Epitaxial Stacking of Crystallographically Incommensurate $Bi_2Se_3$ and $MoSe_2$ Atomic Layers Heterocrystals have been obtained by epitaxial stacking of crystallographically incommensurate $Bi_2Se_3$ and $MoSe_2$ using methods analogues to the ones described above.

Figure 27:
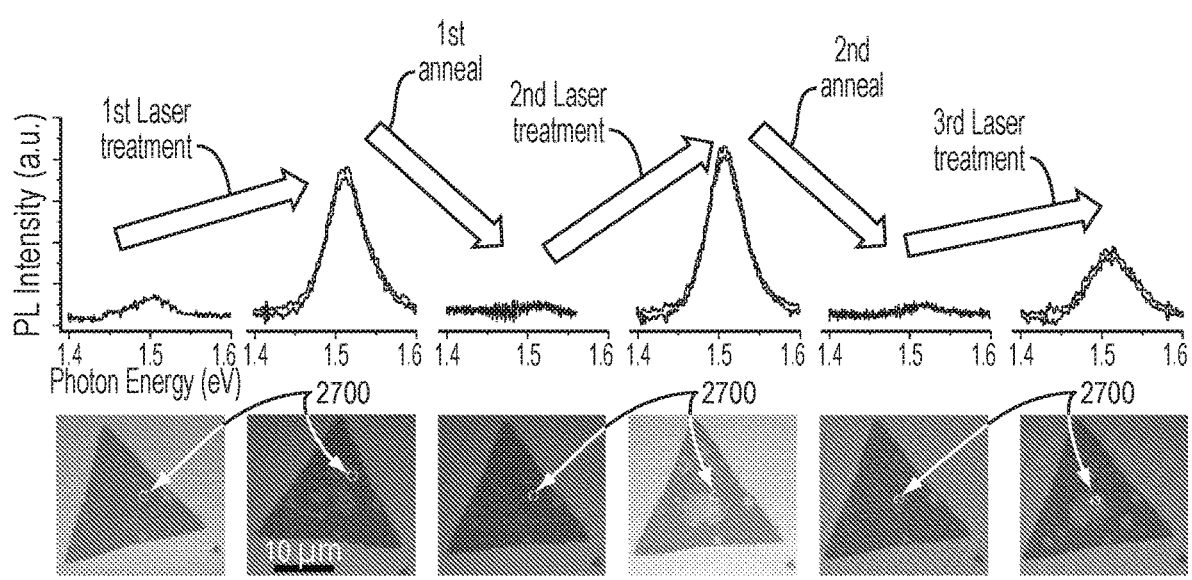
FIG. 27 shows the variation of PL peak-intensity for a heterocrystal of $MoSe_2$ and $Bi_2Se_3$ (under identical illumination conditions; see top) under repeated laser-treatment and annealing cycles, and shows that at least partial recovery is observed with every annealing cycle, representing repeatable "reconfigurable" properties, and images of the heterocrystal with circled positions in which the measurements were taken.

The heterocrystals have been laser-treated and annealed following methods analogues to the ones described above. As can be seen in FIG. 27, the effects of laser treatment of heterocrystals of $Bi_2Se_3$ and $MoSe_2$ can be reversed through annealing. The PL is quenched and the optical color-change is reversed after the sample is annealed, although optical "scarring" from the laser-treatment can still be observed to varying degrees. TEM diffraction data shows that annealing causes the $MoSe_2$, and $Bi_2Se_3$ crystals to become more crystalline, which is believed to be due to the heterocrystal re-forming. The annealed samples are not always crystallographically aligned along 0°, but instead there appear to be several stable points at various rotations. The annealing data indicates that the heterocrystals have repeatable "reconfigurable" properties. The circles 2700 indicate where the measurements were taken.

Figure 28:
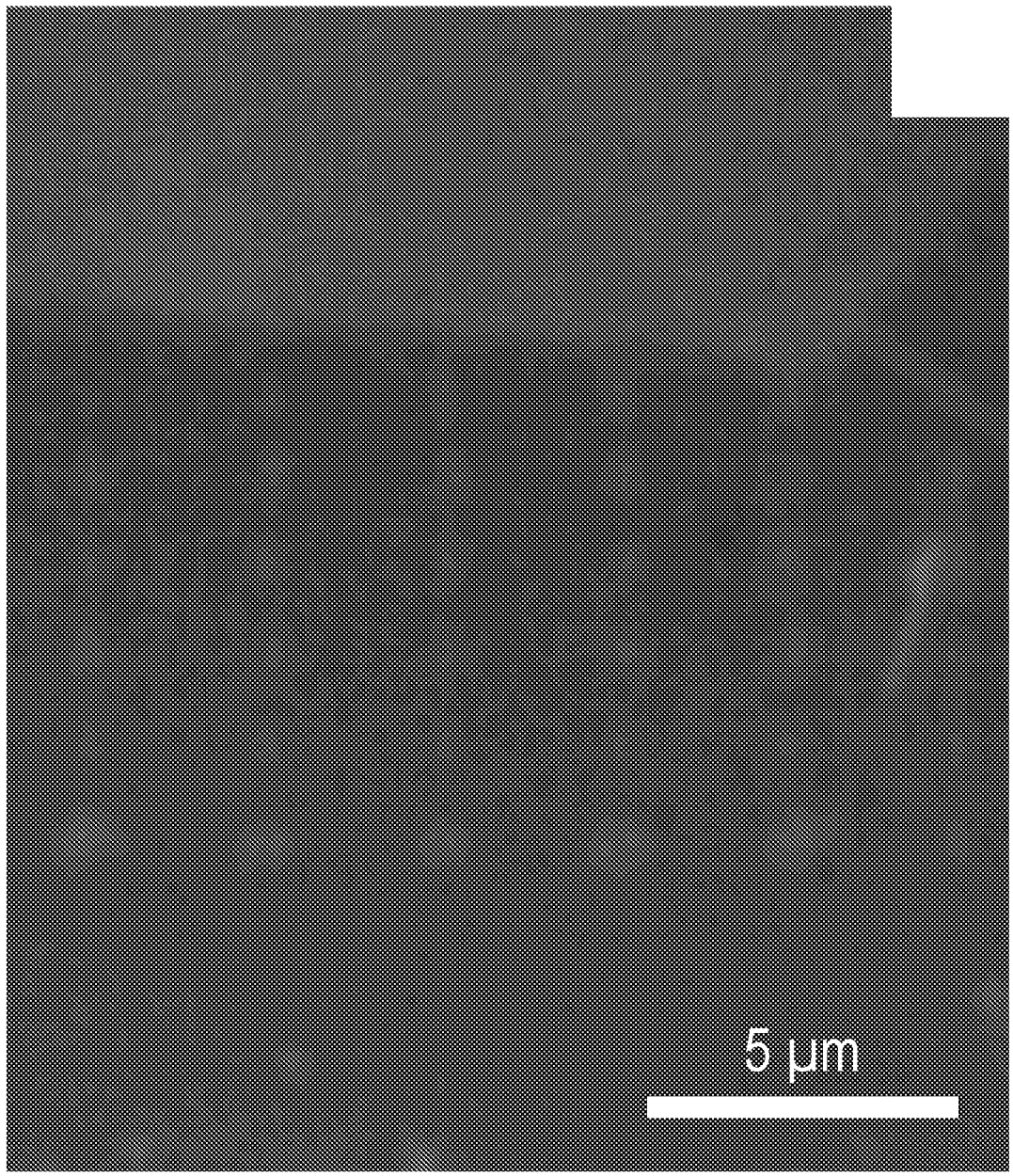
FIG. 28 shows a grid of dots with submicron resolution written into a heterocrystal of $Bi_2Se_3$ and $MoSe_2$.
Figure 29:
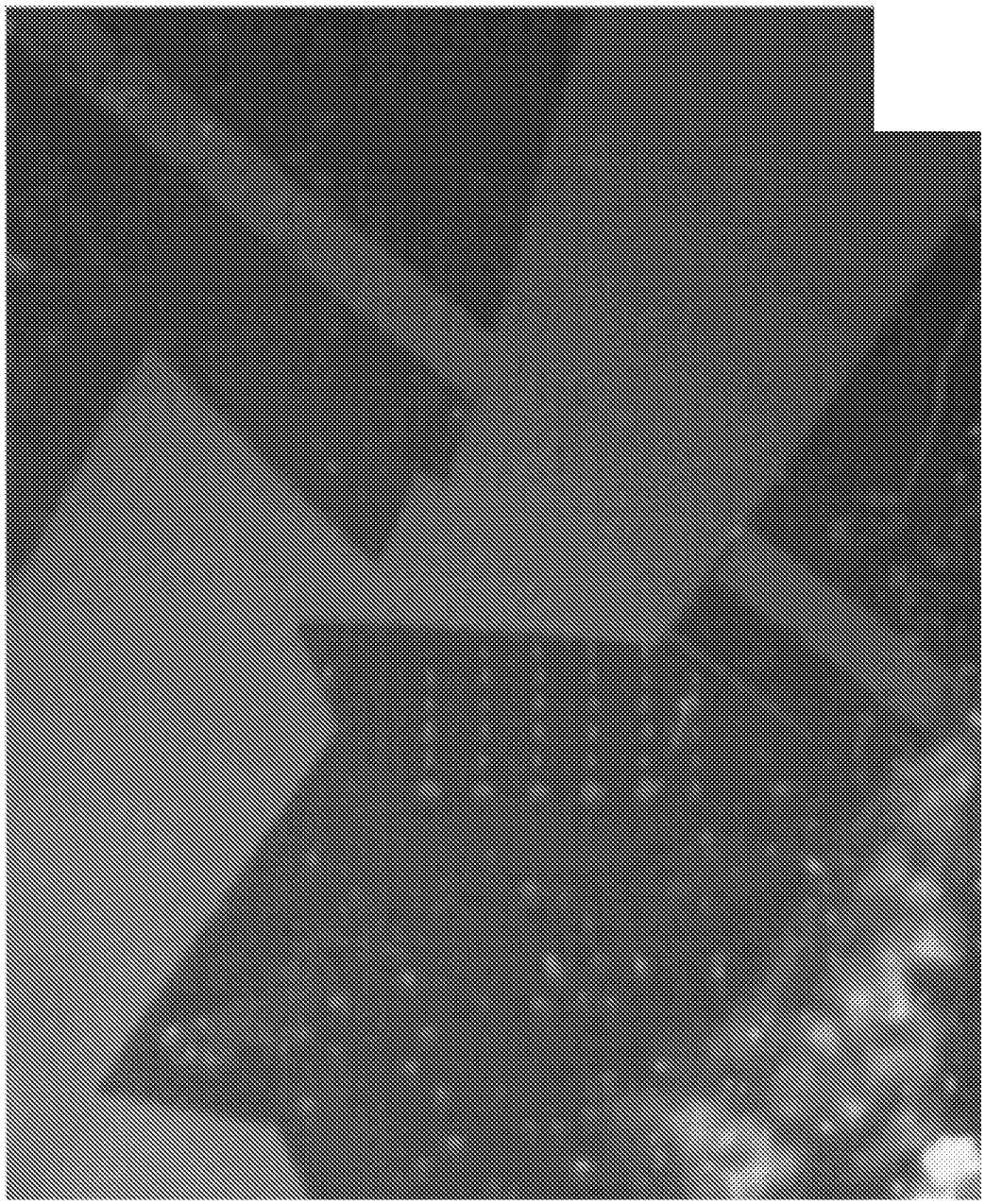
FIG. 29 shows the grid of dots of FIG. 28 with submicron resolution written into a heterocrystal of $Bi_2Se_3$ and $MoSe_2$ at lesser magnification.
Figure 30:
FIG. 30 shows the letters "NEU", the acronym for Northeastern University, written into a heterocrystal of $Bi_2Se_3$ and $MoSe_2$.
Figure 31:
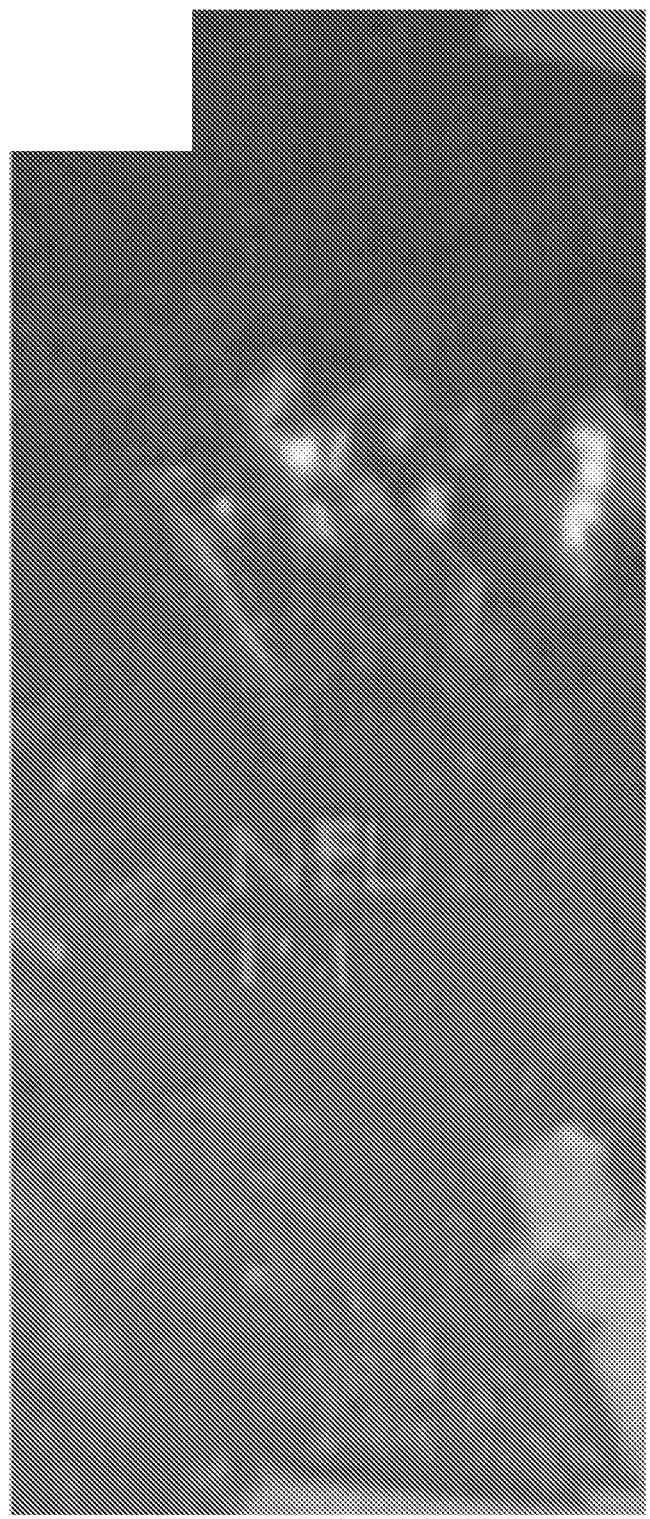
FIG. 31 shows the heterocrystal $Bi_2Se_3$ and $MoSe_2$ with the letters "NEU" written into it, as shown in FIG. 30, at lesser magnification.

FIGS. 28 and 29 show a grid of dots with submicron resolution written into a heterocrystal of $Bi_2Se_3$ and $MoSe_2$, which can represent binary digits. FIGS. 30 and 31 show the letters "NEU", the acronym for Northeastern University, written into a heterocrystal of $Bi_2Se_3$ and $MoSe_2$. The sample used to demonstrate the writing has scratches and portions that grew as bulk $MoSe_2$. Despite the rough handling and imperfect growth conditions, the sample has remained stable enough for writing. Laser-treating the heterocrystals causes the silicon raman peak ($\sim$520 $cm^{-1}$) to increase substantially, and very often the $Bi_2Se_3$ raman peaks ($\sim$150 $cm^{-1}$) will decrease and the TMD's raman peaks to increase after laser treatment. It is believed that the silicon raman peak is increasing because laser-treating causes the heterocrystals to become more translucent, which has been shown to be the case in the $MoS_2+Bi_2Se_3$ heterocrystals (see above). Interestingly, annealing causes the silicon peak to decrease, and the $Bi_2Se_3$ peaks to increase, which provides evidence that annealing causes the heterocrystals to re-form.

2D Heterocrystals Obtained by Epitaxial Stacking of Crystallographically Incommensurate $Bi_2Se_3$ and $WS_2$ Atomic Layers Heterocrystals have been obtained by epitaxial stacking of crystallographically incommensurate $Bi_2Se_3$ and $WS_2$ using methods analogues to the ones described above.

Figure 32:
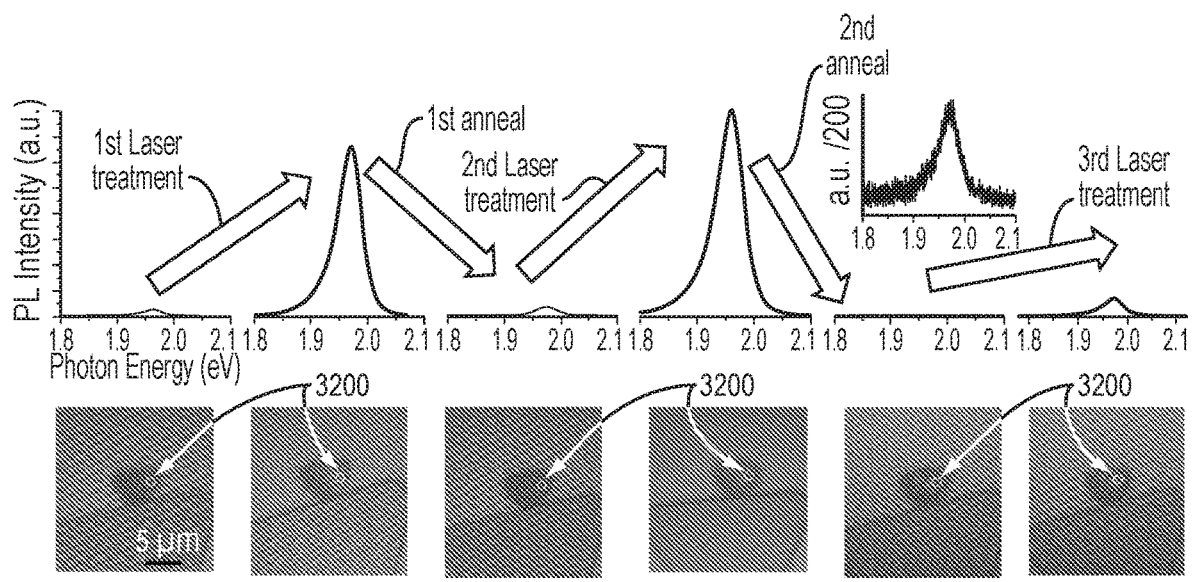
FIG. 32 shows the variation of PL peak-intensity for a heterocrystal of $WS_2$ and $Bi_2Se_3$ (under identical illumination conditions; see top) under repeated laser-treatment and annealing cycles, and shows that at least partial recovery is observed with every annealing cycle, representing repeatable "reconfigurable" properties, and images of the heterocrystal with circled positions in which the measurements were taken.

The heterocrystals have been laser-treated and annealed following methods analogues to the ones described above. As can be seen in FIG. 32, the effects of laser treatment of heterocrystals of $Bi_2Se_3$ and $WS_2$ can be reversed through annealing. The PL is quenched and the optical color-change is reversed after the sample is annealed, although optical "scarring" from the laser-treatment can still be observed to varying degrees. TEM diffraction data shows that annealing causes the $WS_2$, and $Bi_2Se_3$ crystals to become more crystalline, which is believed to be due to the heterocrystal re-forming. The annealed samples are not always crystallographically aligned along 0°, but instead there appear to be several stable points at various rotations. The annealing data indicates that the heterocrystals have repeatable "reconfigurable" properties. The circles 2700 indicate where the measurements were taken.

Laser-treating the heterocrystals causes the silicon raman peak ($\sim$520 $cm^{-1}$) to increase substantially, and very often the $Bi_2Se_3$ raman peaks ($\sim$150 $cm^{-1}$) will decrease and the TMD's raman peaks to increase after laser treatment. It is believed that the silicon raman peak is increasing because laser-treating causes the heterocrystals to become more translucent, which has been shown to be the case in the $MoS_2+Bi_2Se_3$ heterocrystals (see above). Interestingly, annealing causes the silicon peak to decrease, and the $Bi_2Se_3$ peaks to increase, which provides evidence that annealing causes the heterocrystals to re-form.

The relevant teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:

1. A heterocrystal consisting of a metal dichalcogenide having the formula $ME_2$ in contact with $Bi_2S_3$, $Bi_2Se_3$ or $Bi_2Te_3$, wherein M is a Cr, Mo, or W and E is S, Se, or Te; or a heterocrystal consisting of $MoS_2$ in contact with $Bi_2Te_3$; wherein the $ME_2$ and $Bi_2S_3$, $Bi_2Se_3$ or $Bi_2Te_3$ have an interface area in which they contact, and the interface has been disrupted in selected positions to thereby reverse suppression of photoluminescence in these positions, wherein positions of the heterocrystal with suppressed photoluminescence and positions with photoluminescence are part of a photonic circuit or an optoelectronic circuit, wherein the heterocrystal exhibits a photonic pattern which has been formed by reconfiguring positions of the heterocrystal.

2. The heterocrystal of claim 1, wherein the heterocrystal is characterized by lattice matching between 4×4 unit cells of $MoS_2$ and 3×3 unit cells of $Bi_2Se_3$, lattice matching between 4×4 unit cells of $WS_2$ and 3×3 unit cells of $Bi_2Se_3$, or lattice matching between 5×5 unit cells of $MoSe_2$ and 4×4 unit cells of $Bi_2Se_3$.

3. The heterocrystal of claim 1, wherein $ME_2$ and $Bi_2S_3$, $Bi_2Se_3$ or $Bi_2Te_3$ provide a rotationally-aligned epitaxial stack.

4. The heterocrystal of claim 1, wherein positions of the heterocrystal exhibit unsuppressed photoluminescence whereas elsewhere the heterocrystal exhibits suppressed photoluminescence.

5. The heterocrystal of claim 1, wherein positions of the heterocrystal exhibit photoluminescence whereas elsewhere photoluminescence is suppressed by at least 90% relative to the photoluminescence at the positions, wherein the positions form a pattern encoding information.

6. The heterocrystal of claim 1, wherein positions of the heterocrystal exhibit photoluminescence whereas elsewhere photoluminescence is suppressed by at least 90% relative to the photoluminescence at the positions.

7. The heterocrystal of claim 1, wherein positions of the heterocrystal with suppressed photoluminescence and positions with photoluminescence represent bits of information.

8. The heterocrystal of claim 1, wherein positions of the heterocrystal have been exposed to a beam of electromagnetic waves or particles to form exposed areas of increased average height and root means square surface roughness relative to untreated areas.

9. The heterocrystal of claim 1, wherein positions of the heterocrystal have been exposed to a beam of electromagnetic waves or particles to form exposed areas of an average height increased by 0.35 to 0.45 nm.

10. The heterocrystal of claim 1, wherein positions of the heterocrystal have been exposed to a beam of electromagnetic waves or particles to form exposed areas of randomly-oriented grains of $Bi_2Se_3$ that remain attached to a surface of $ME_2$.

11. The heterocrystal of claim 1, wherein positions of the heterocrystal have been exposed to a beam of electromagnetic waves or particles to form exposed areas with photoluminescence recovered by at least 10% relative to untreated areas.

12. The heterocrystal of claim 1, wherein positions of the heterocrystal with suppressed photoluminescence and positions with photoluminescence are part of the optoelectronic circuit.

13. The heterocrystal of claim 1, wherein positions of the heterocrystal have been exposed to a beam of electromagnetic waves or particles to form exposed areas with sub-micrometer spatial resolution.

14. The heterocrystal of claim 1, wherein positions have been light-treated by exposure to light of a wavelength of 200 nm to 1100 nm focused onto a spot size below 10 μm with 100 nW/μm$^2$ to 1 mW/μm$^2$ intensity.

15. The heterocrystal of claim 1, wherein positions have been light-treated by exposure to light of a wavelength of about 488 nm focused onto a spot size below 1 μm with about 76 μW/μm$^2$ intensity.

16. A heterocrystal consisting of $MoS_2$ in contact with $Bi_2Se_3$ wherein $MoS_2$ and $Bi_2Se_3$ have an interface area in which they contact, and the interface has been disrupted in selected positions to thereby reverse suppression of photoluminescence in these positions, wherein positions of the heterocrystal with suppressed photoluminescence and positions with photoluminescence are part of a photonic circuit or an optoelectronic circuit, wherein the heterocrystal exhibits a photonic pattern which has been formed by reconfiguring positions of the heterocrystal.

17. The heterocrystal of claim 16, wherein the heterocrystal is characterized by lattice matching between 4×4 unit cells of $MoS_2$ and 3×3 unit cells of $Bi_2Se_3$.

18. The heterocrystal of claim 16, wherein $MoS_2$ and $Bi_2Se_3$ provide a rotationally-aligned epitaxial stack.

19. The heterocrystal of claim 16, wherein positions of the heterocrystal exhibit unsuppressed photoluminescence whereas elsewhere the heterocrystal exhibits suppressed photoluminescence.

20. The heterocrystal of claim 16, wherein positions of the heterocrystal exhibit photoluminescence whereas elsewhere photoluminescence is suppressed by at least 90% relative to the photoluminescence at the positions, wherein the positions form a pattern encoding information.

21. The heterocrystal of claim 16, wherein positions of the heterocrystal exhibit photoluminescence whereas elsewhere photoluminescence is suppressed by at least 90% relative to the photoluminescence at the positions.

22. The heterocrystal of claim 16, wherein positions of the heterocrystal with suppressed photoluminescence and positions with photoluminescence represent bits of information.

23. The heterocrystal of claim 16, wherein positions of the heterocrystal with suppressed photoluminescence and positions with photoluminescence are part of the optoelectronic circuit.

24. The heterocrystal of claim 16, wherein positions of the heterocrystal have been exposed to a beam of electromagnetic waves or particles to form exposed areas with sub-micrometer spatial resolution.

25. The heterocrystal of claim 16, wherein positions have been light-treated by exposure to light of a wavelength of 200 nm to 1100 nm focused onto a spot size below 10 μm with 100 nW/μm$^2$ to 1 mW/μm$^2$ intensity.

26. The heterocrystal of claim 16, wherein positions have been light-treated by exposure to light of a wavelength of about 488 nm focused onto a spot size below 1 μm with about 76 μW/μm$^2$ intensity.

* * * * *